US006240029B1

(12) United States Patent
Callahan

(10) Patent No.: US 6,240,029 B1
(45) Date of Patent: May 29, 2001

(54) MEMORY COLUMN REDUNDANCY

(75) Inventor: John M. Callahan, San Ramon, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 0 days.

(21) Appl. No.: 09/546,919

(22) Filed: Apr. 11, 2000

(51) Int. Cl.$^7$ ....................................................... G11C 7/00
(52) U.S. Cl. .................... 365/200; 365/189.02; 365/205; 365/230.03
(58) Field of Search ............................... 365/200, 189.02, 365/205, 230.03, 189.01, 230.01

(56) References Cited

U.S. PATENT DOCUMENTS 5,471,426 * 11/1995 McClure ............................. 365/200
5,673,227 * 9/1997 Engles et al. ..................... 365/200
6,163,489 * 12/2000 Blodgett ............................. 365/200

* cited by examiner

Primary Examiner—David Nelms
Assistant Examiner—Hoai V. Ho
(74) Attorney, Agent, or Firm—Patrick T. King

(57) ABSTRACT

An incoming memory address signal is compared and matched with static signals provided by a fuse array that represents an address of a defective memory column that is being replaced by a redundant memory column in a memory chip. Each section of a memory is provided with a redundant memory column. Each redundant column of the memory is connected to a separate redundant-column sense amp that is activated by a memory section-select signal in combination with a BIGHIT signal. The BIGHIT signal indicates that the memory chip has received an address of a defective memory column. All of the output terminals of the redundant column senseamps are connected in common to a redundant internal data bus RDINTDB. A defective-column-address detector circuit compares an incoming multi-bit memory address signal to an address of a defective memory column and provides an address-hit signal ADDHIT if a match occurs therebetween. A BIGHIT circuit combines the ADDHIT signals for all of the memory sections to provide the BIGHIT signal when any ADDHIT signal is present. A 2:1 multiplexer connects a redundant senseamp or a normal senseamp to a chip output terminal.

9 Claims, 20 Drawing Sheets

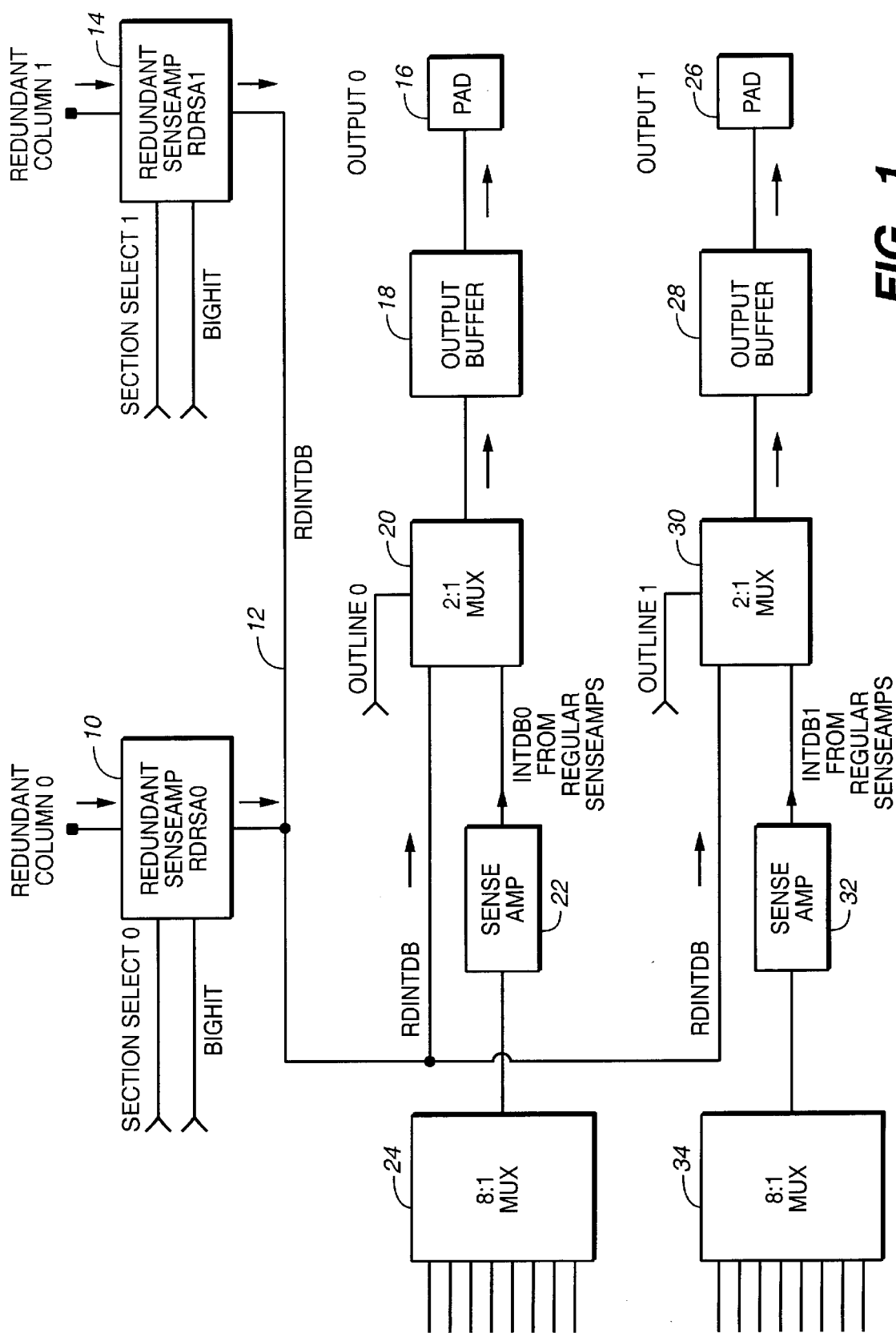
FIG._1

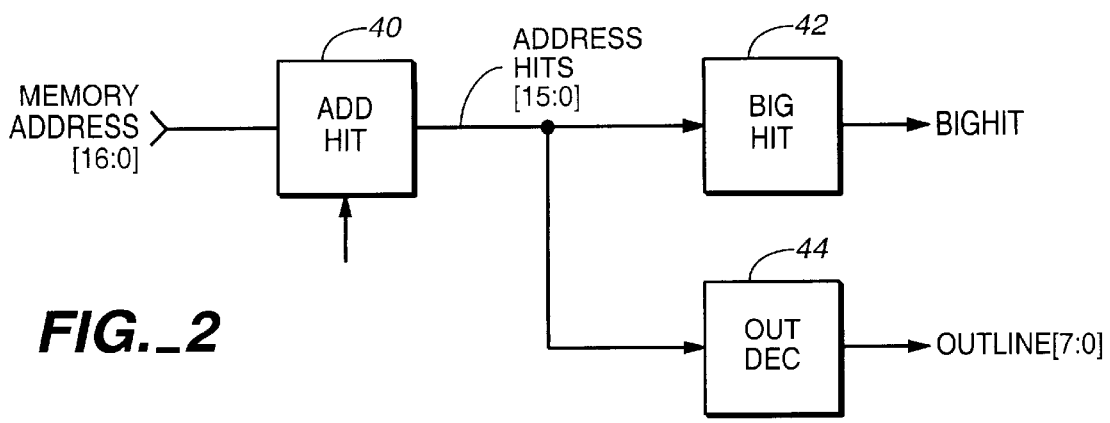
FIG._2
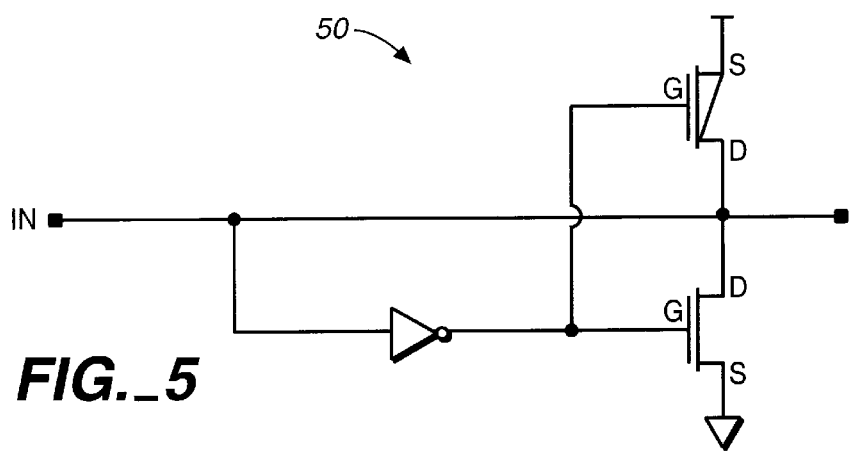
FIG._5
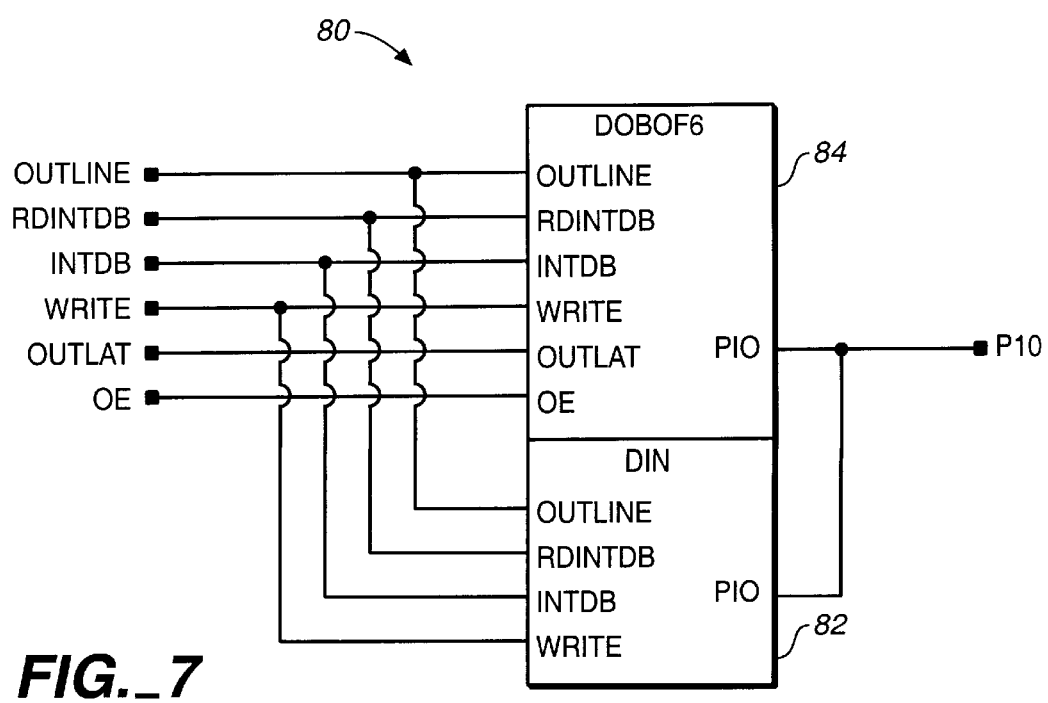
FIG._7

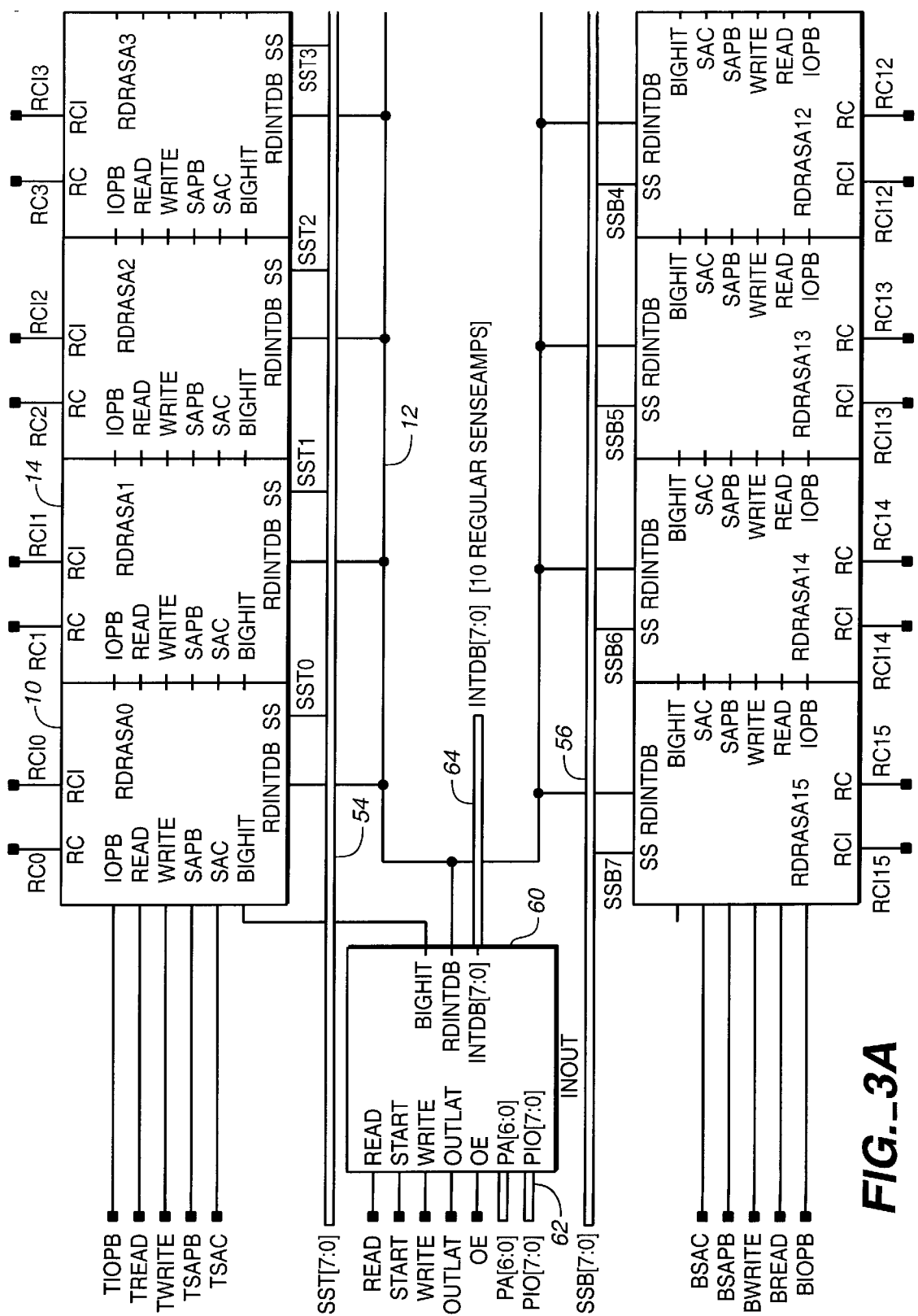
FIG._3A

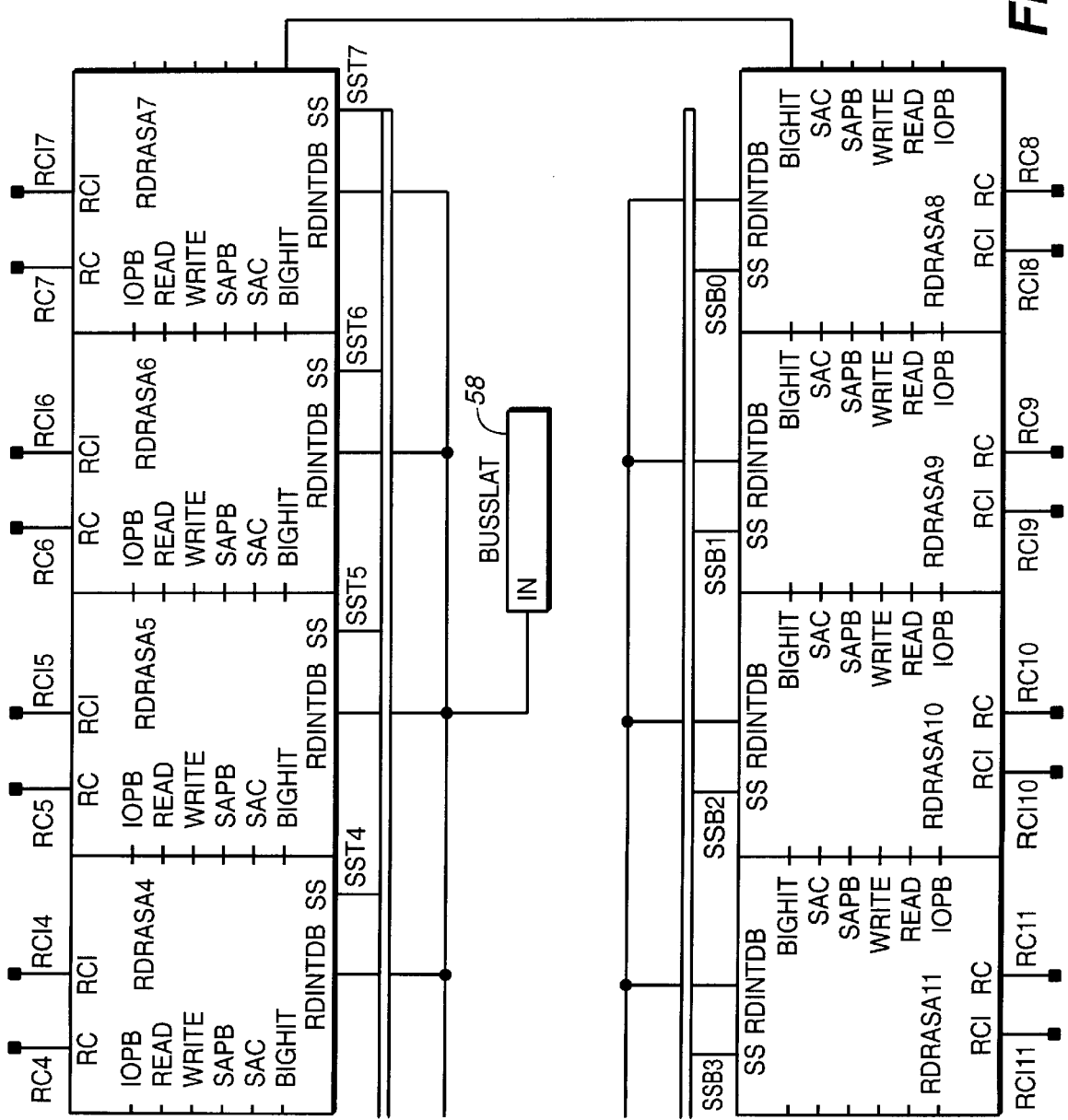
FIG._3
FIG._3A | FIG._3B
FIG._3B

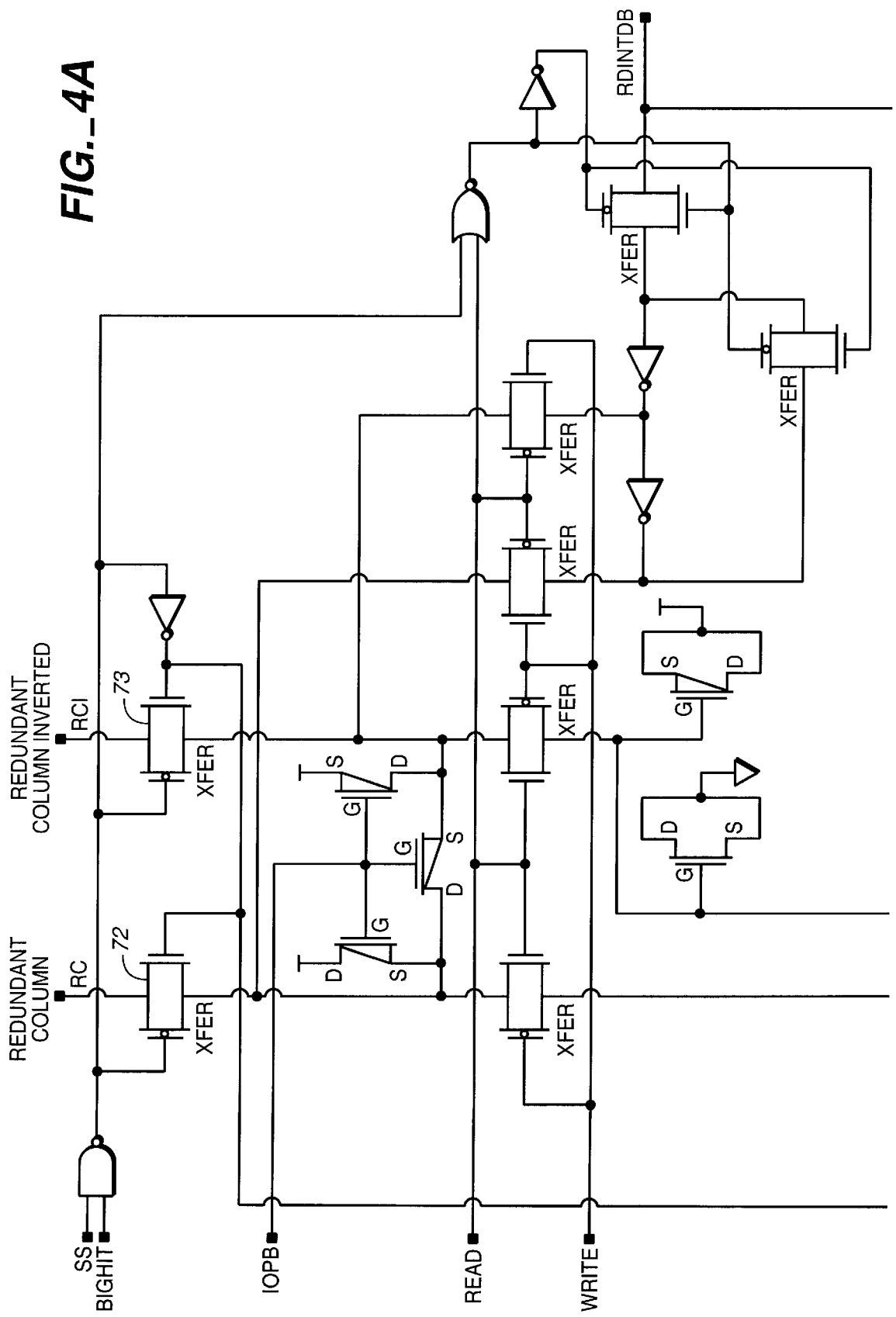
FIG._4A

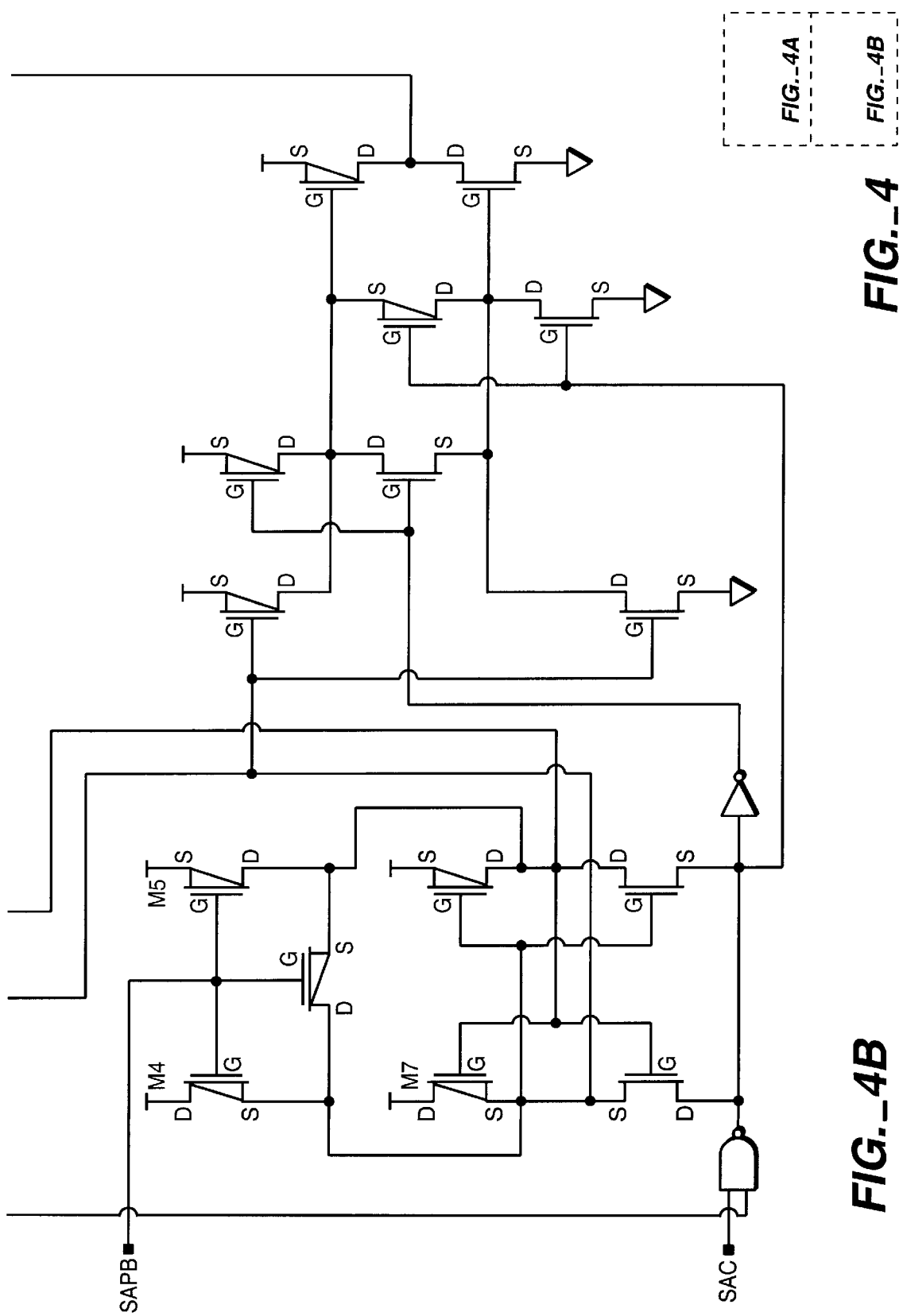

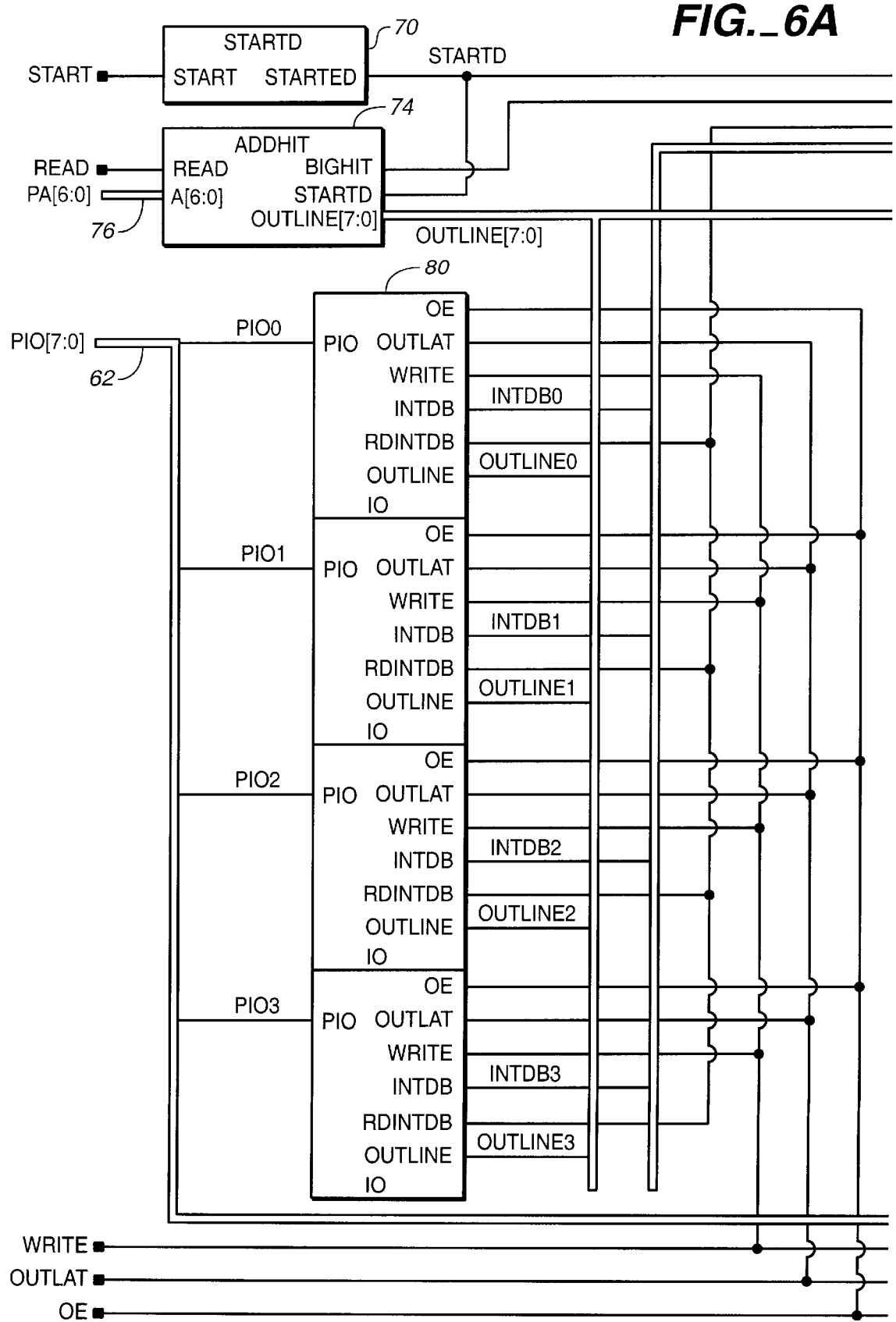
*FIG._6A*

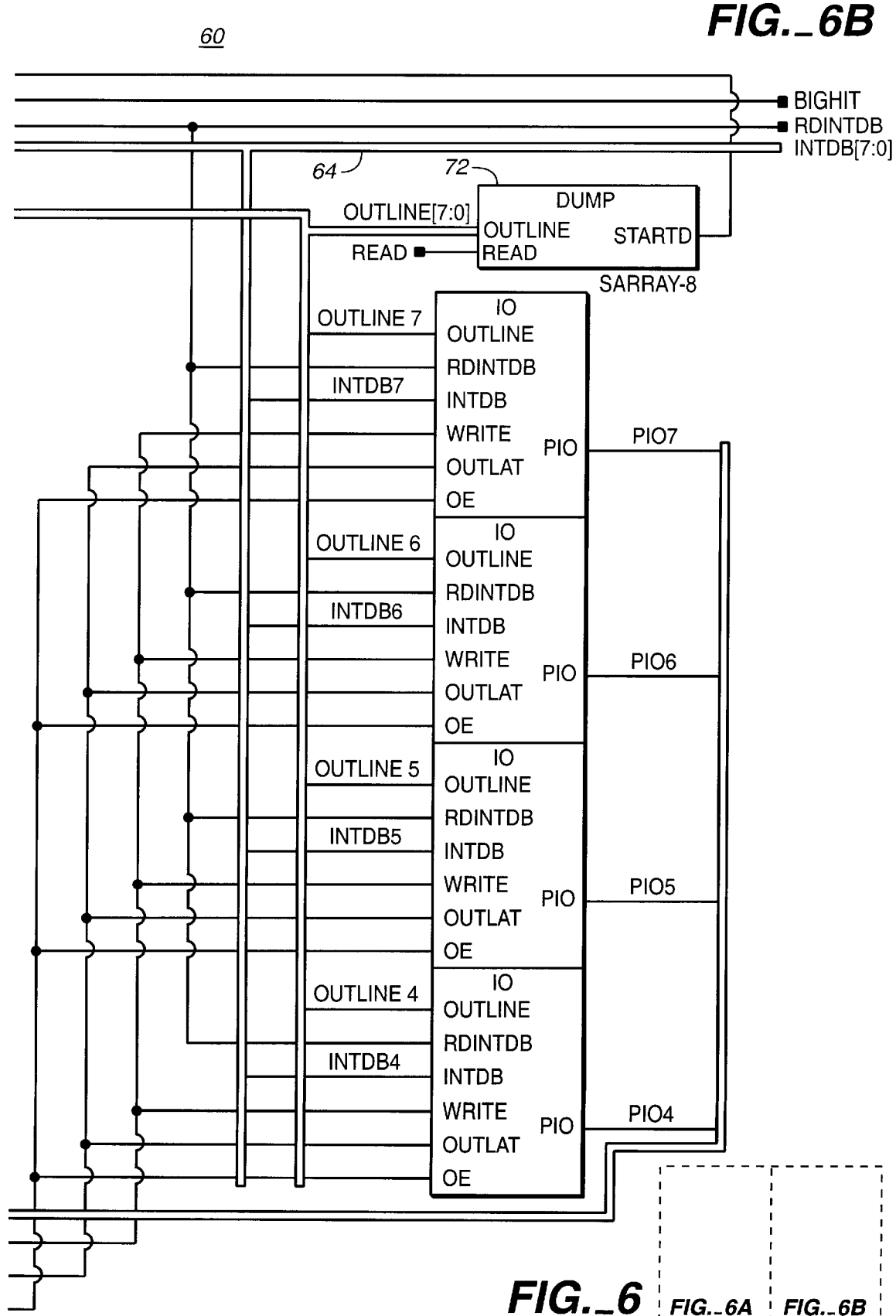
FIG._6B
FIG._6  FIG._6A  FIG._6B

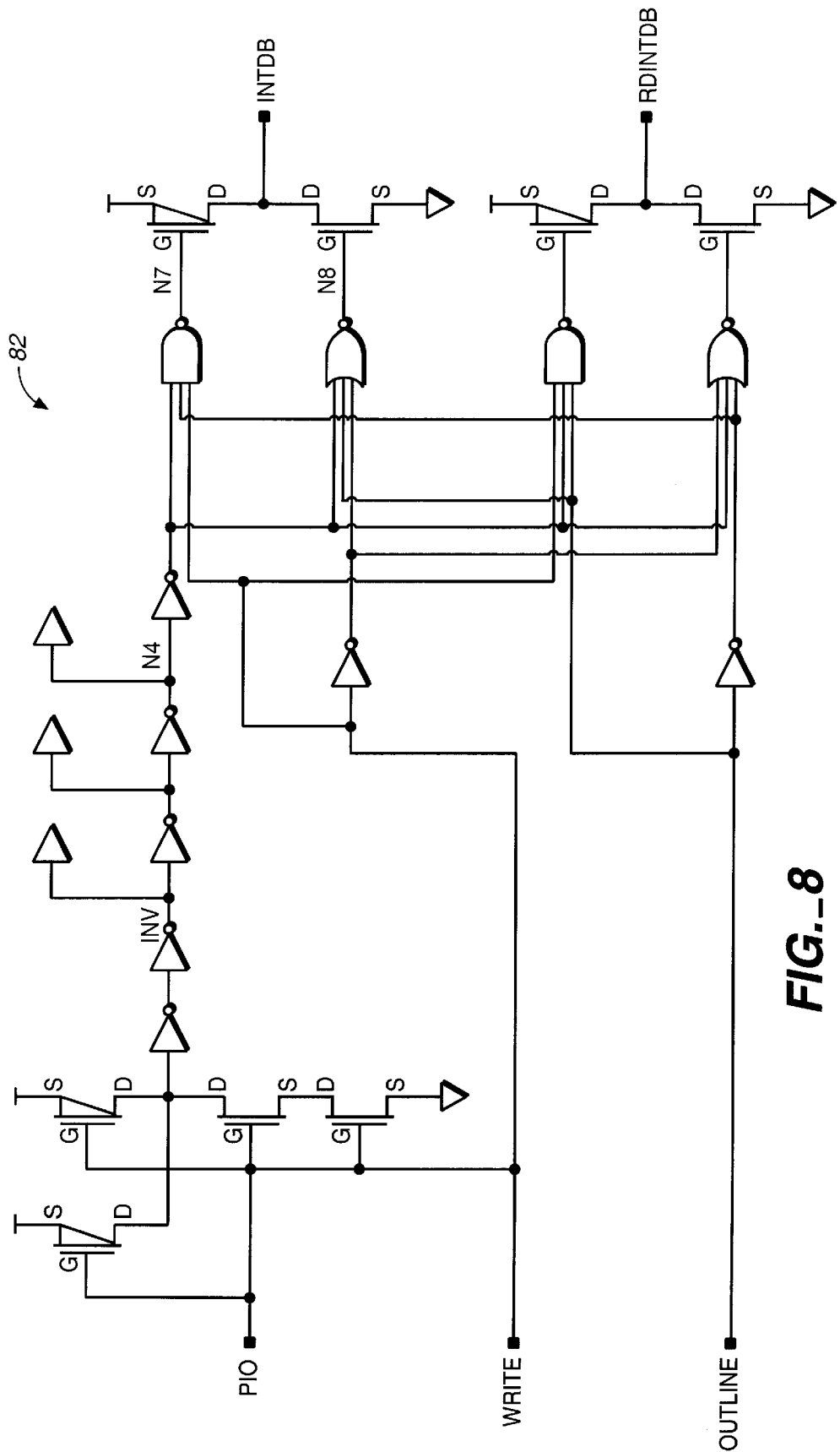
FIG._8

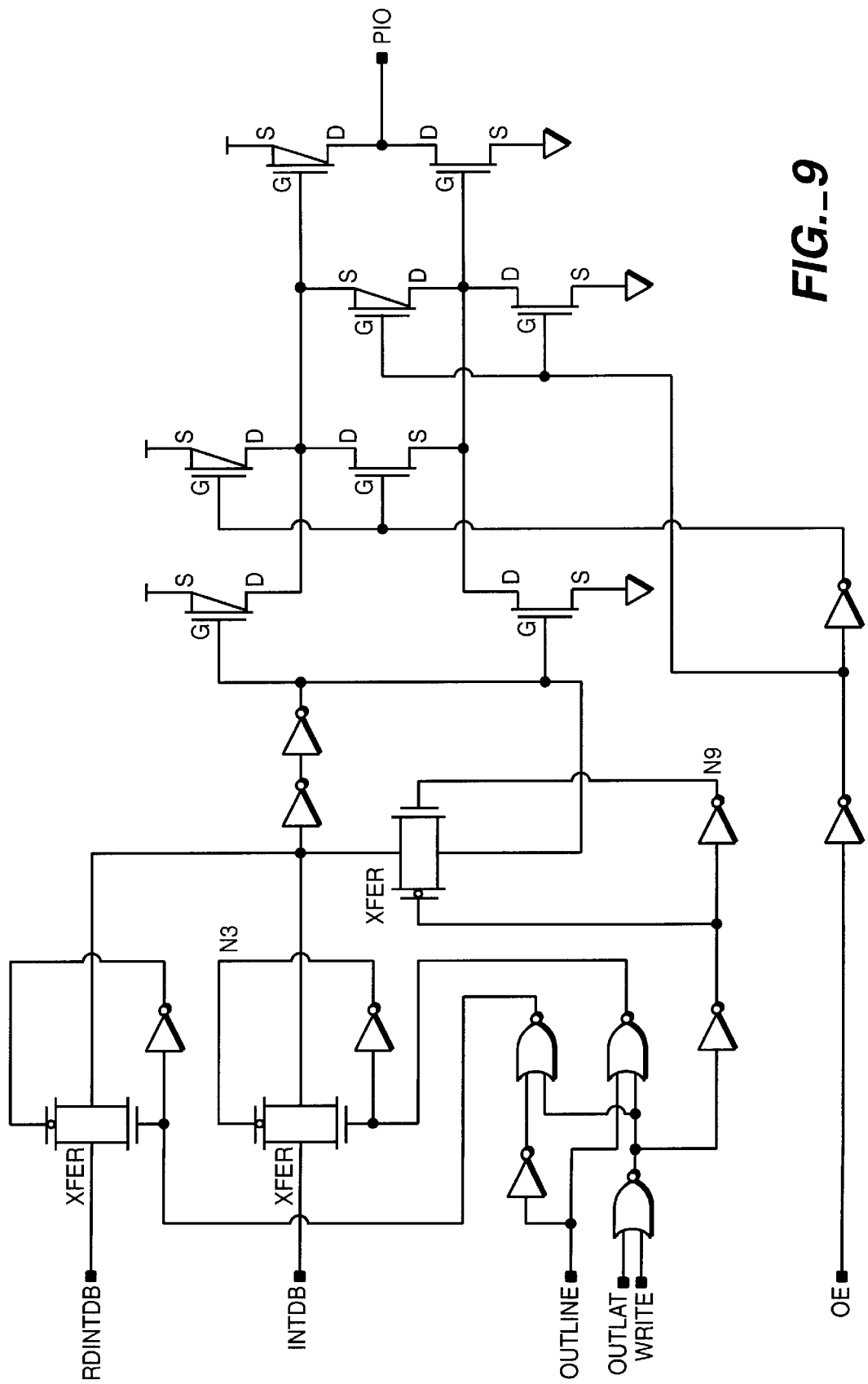
FIG._9

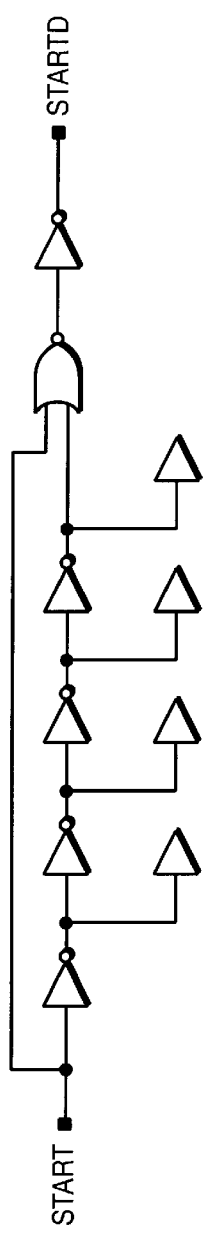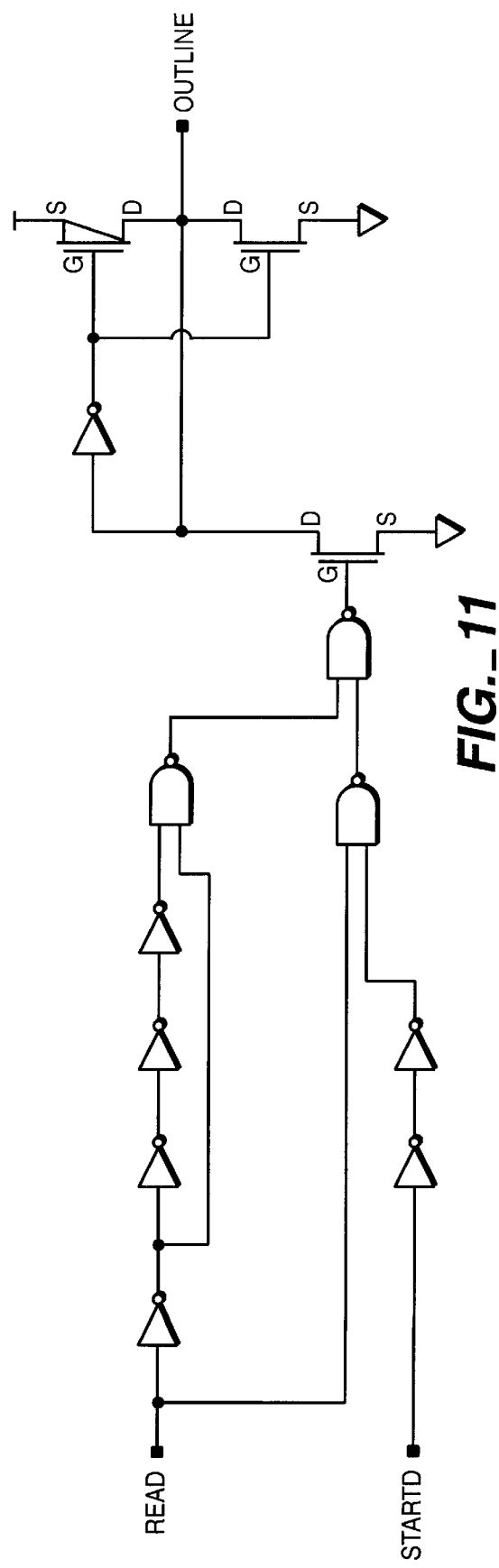
FIG._10
FIG._11

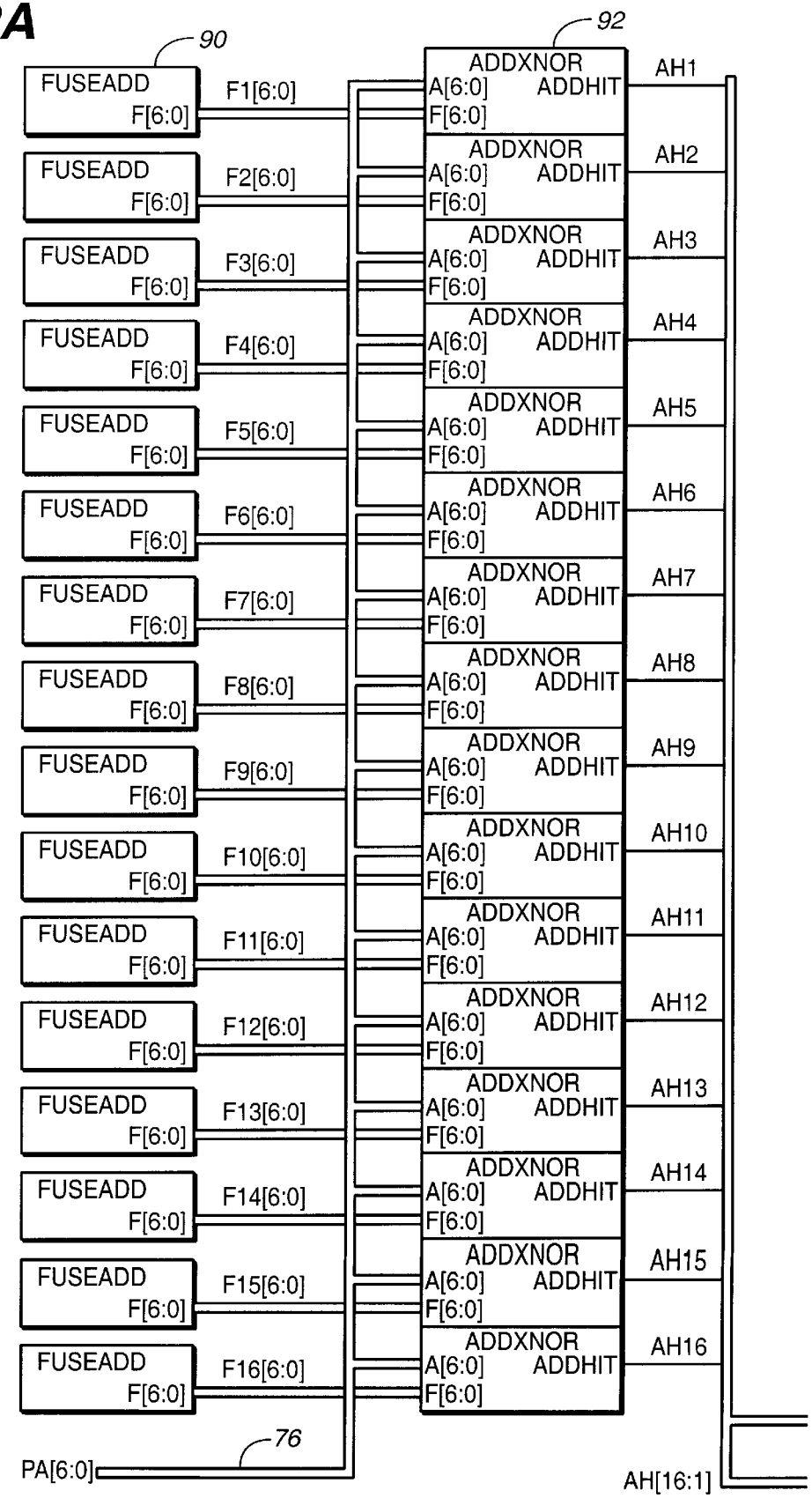
FIG._12A

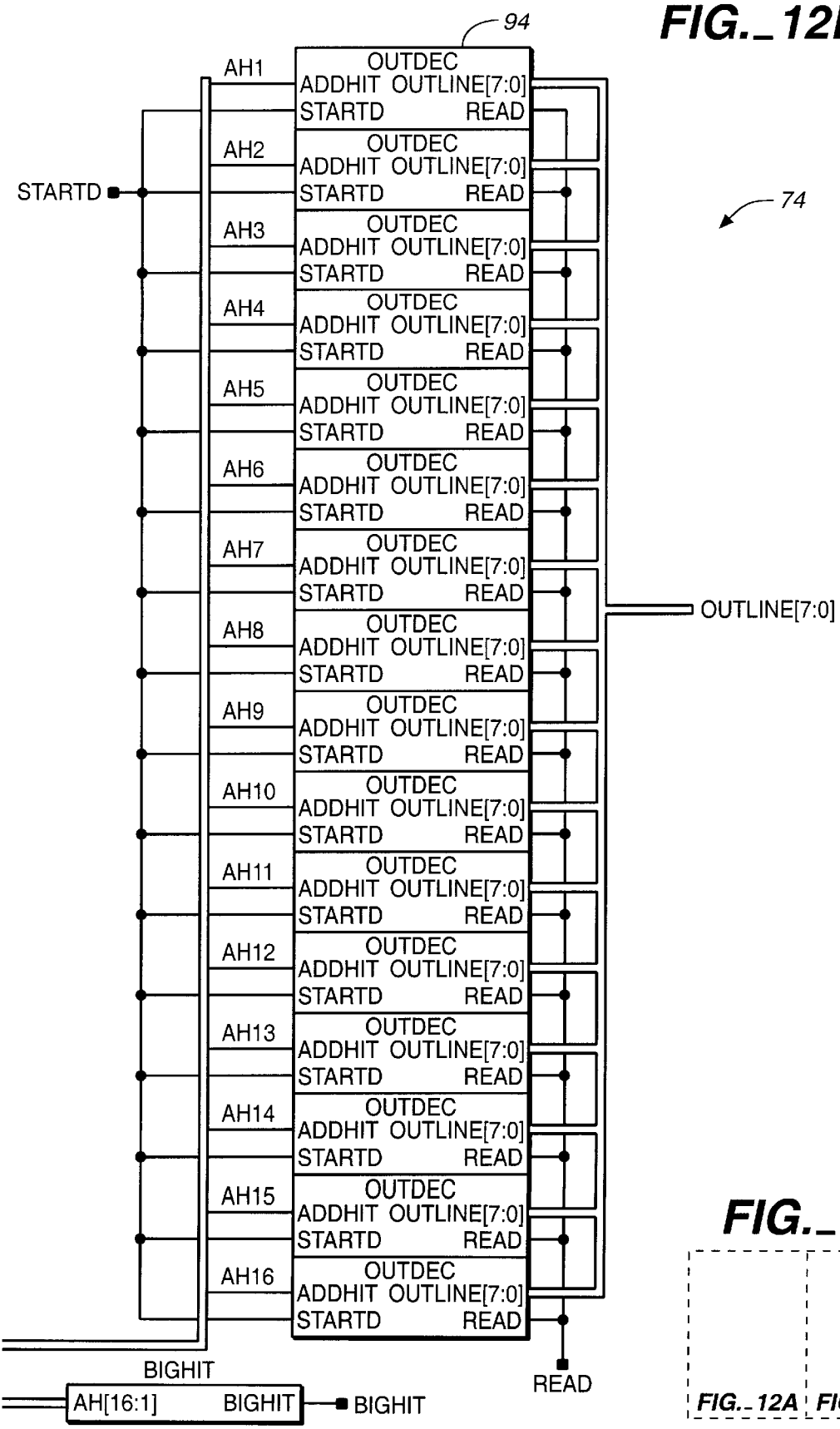
FIG._12B
FIG._12

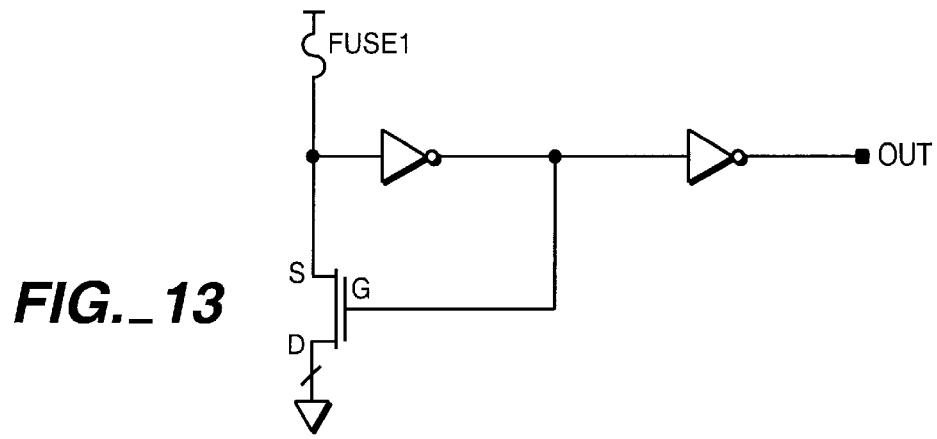
FIG._13
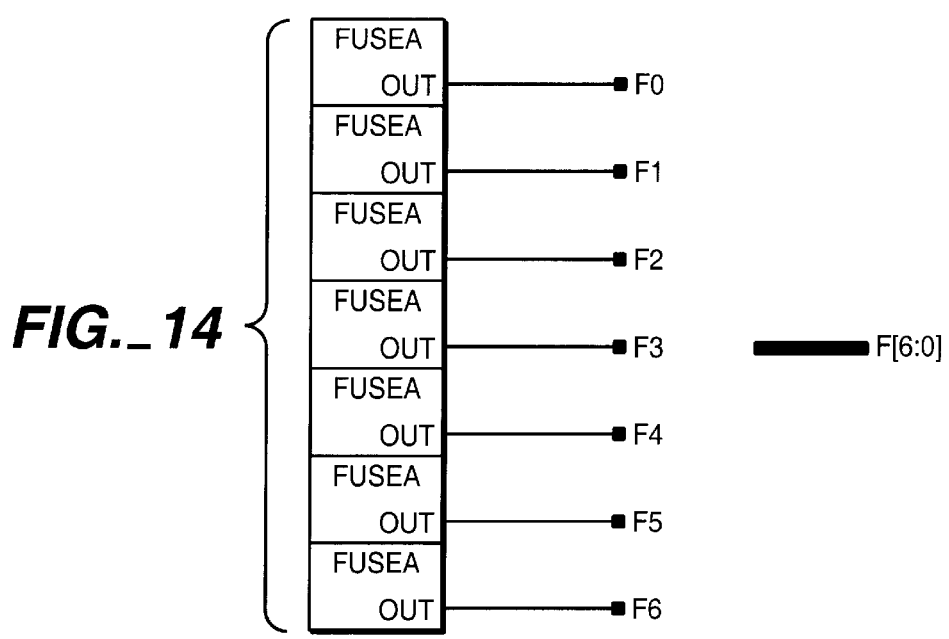
FIG._14
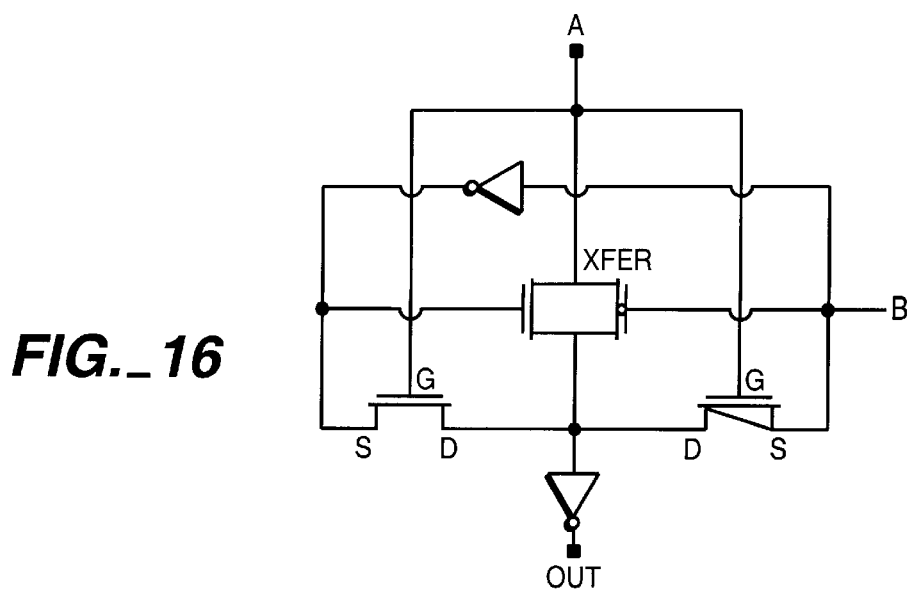
FIG._16

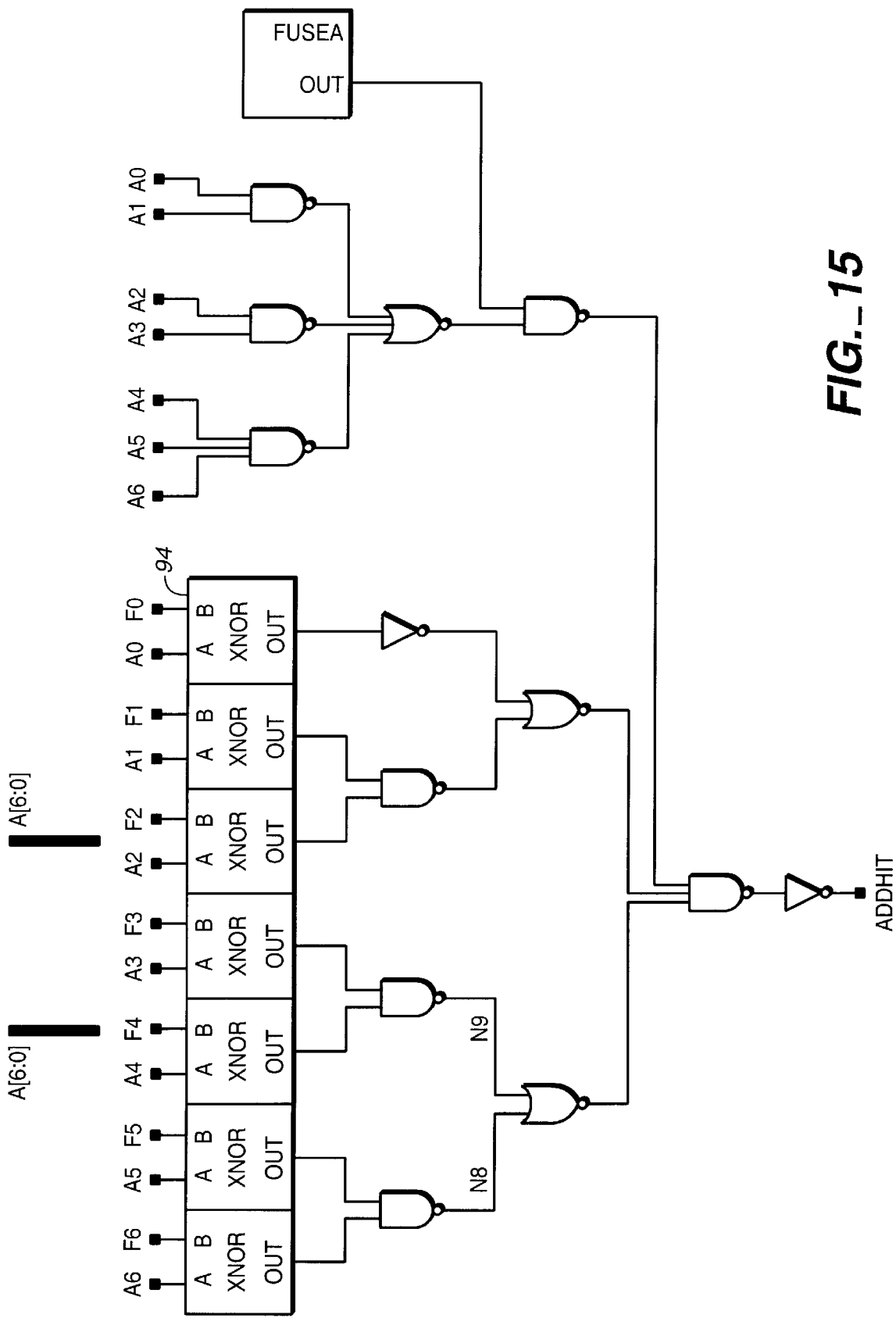
FIG._15

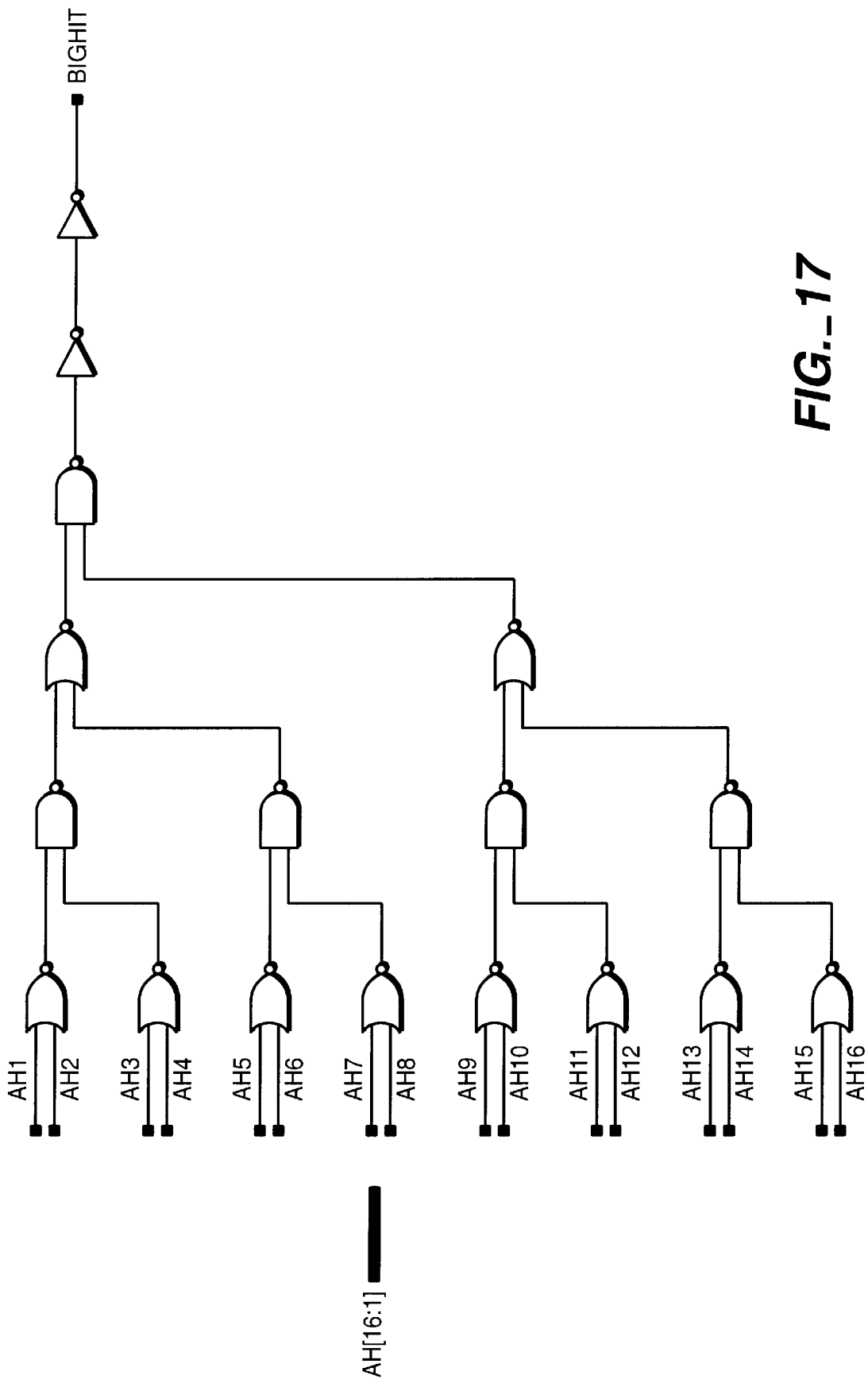
FIG._17

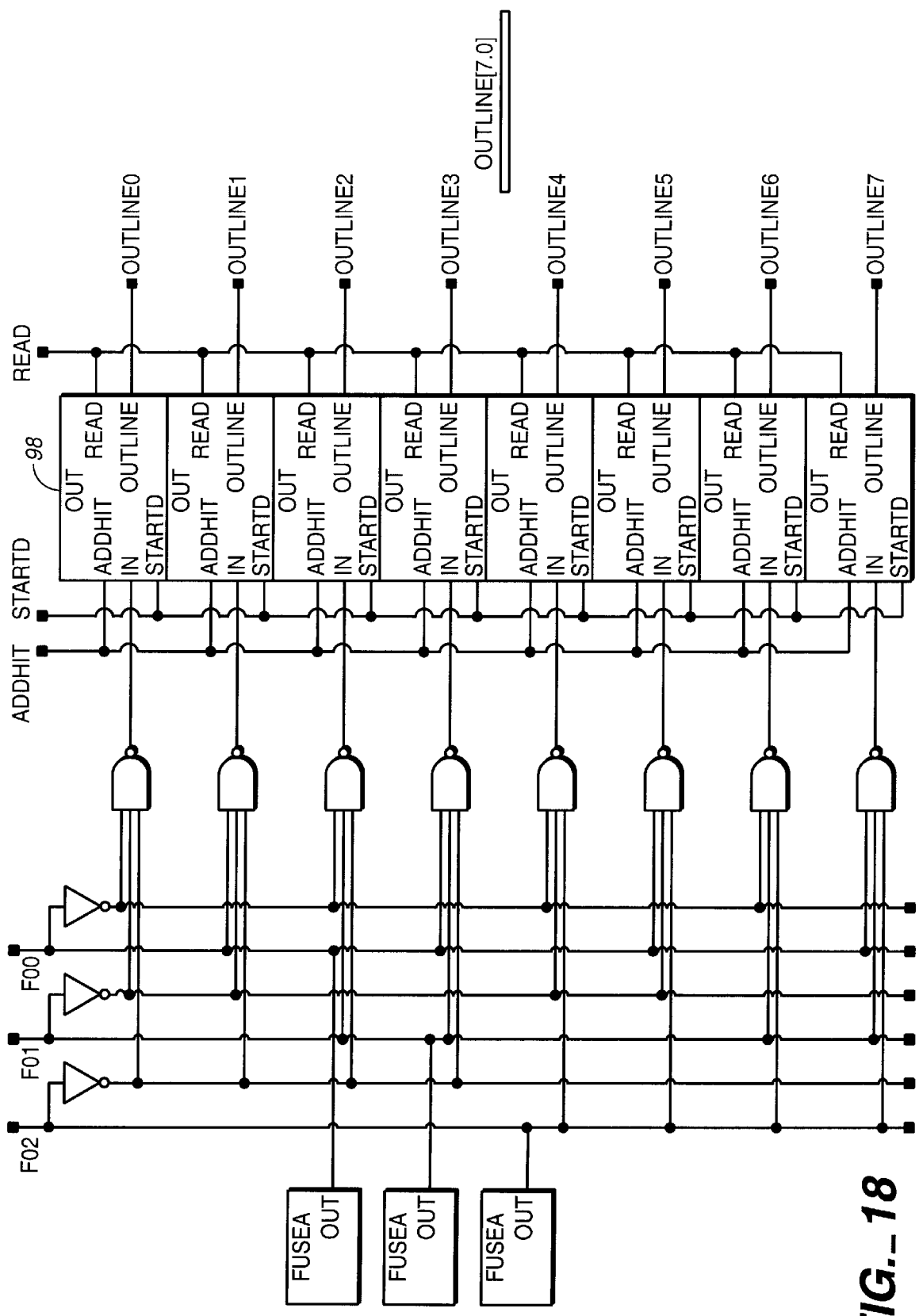
FIG._18

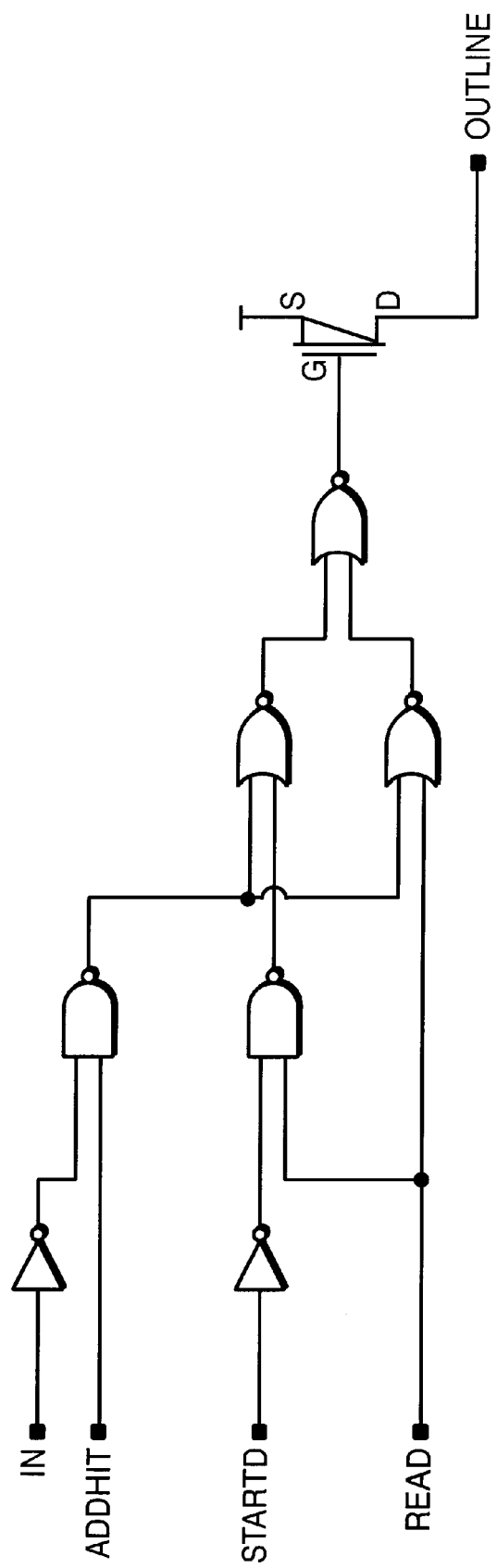
FIG._19

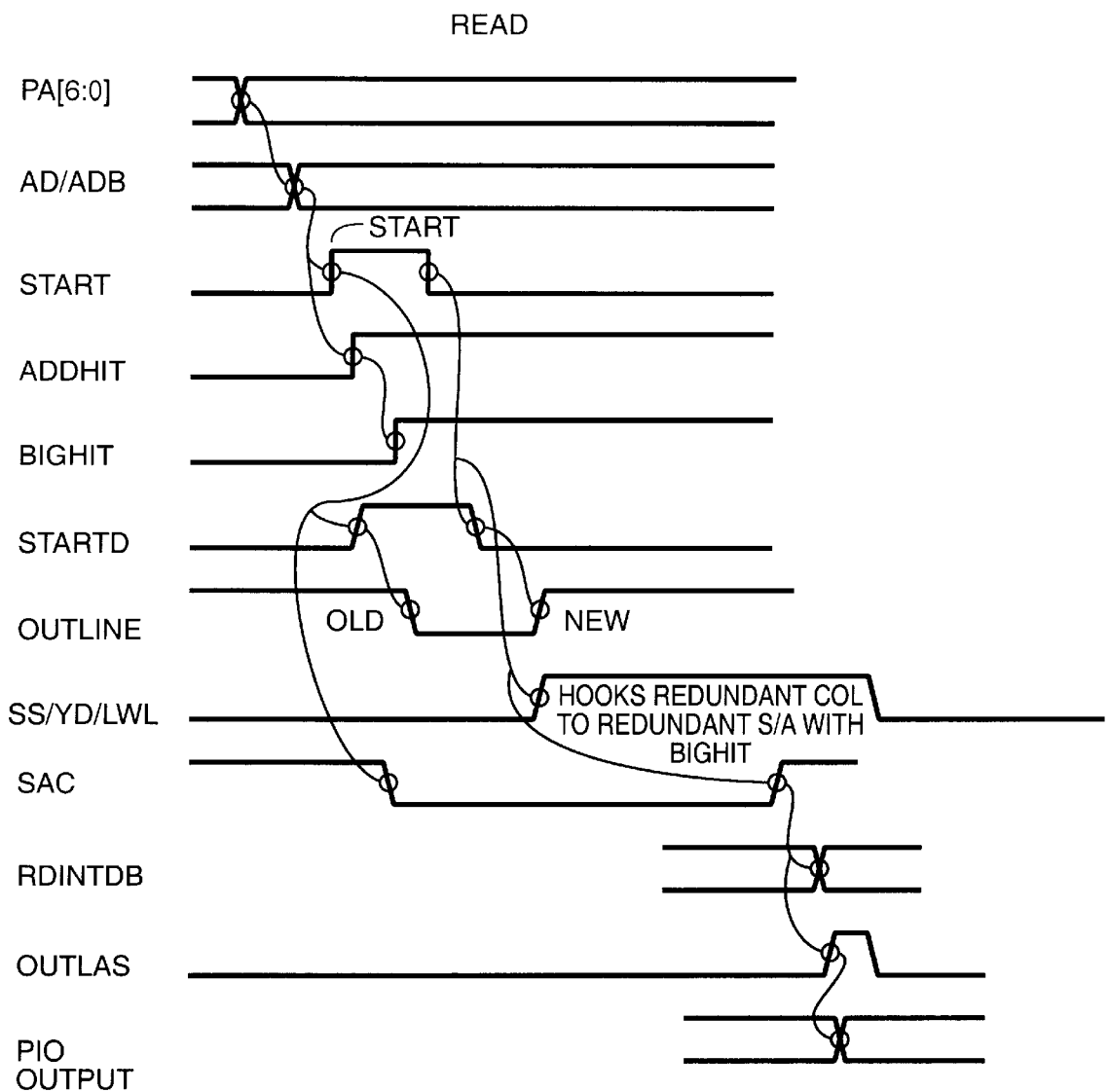
FIG._20

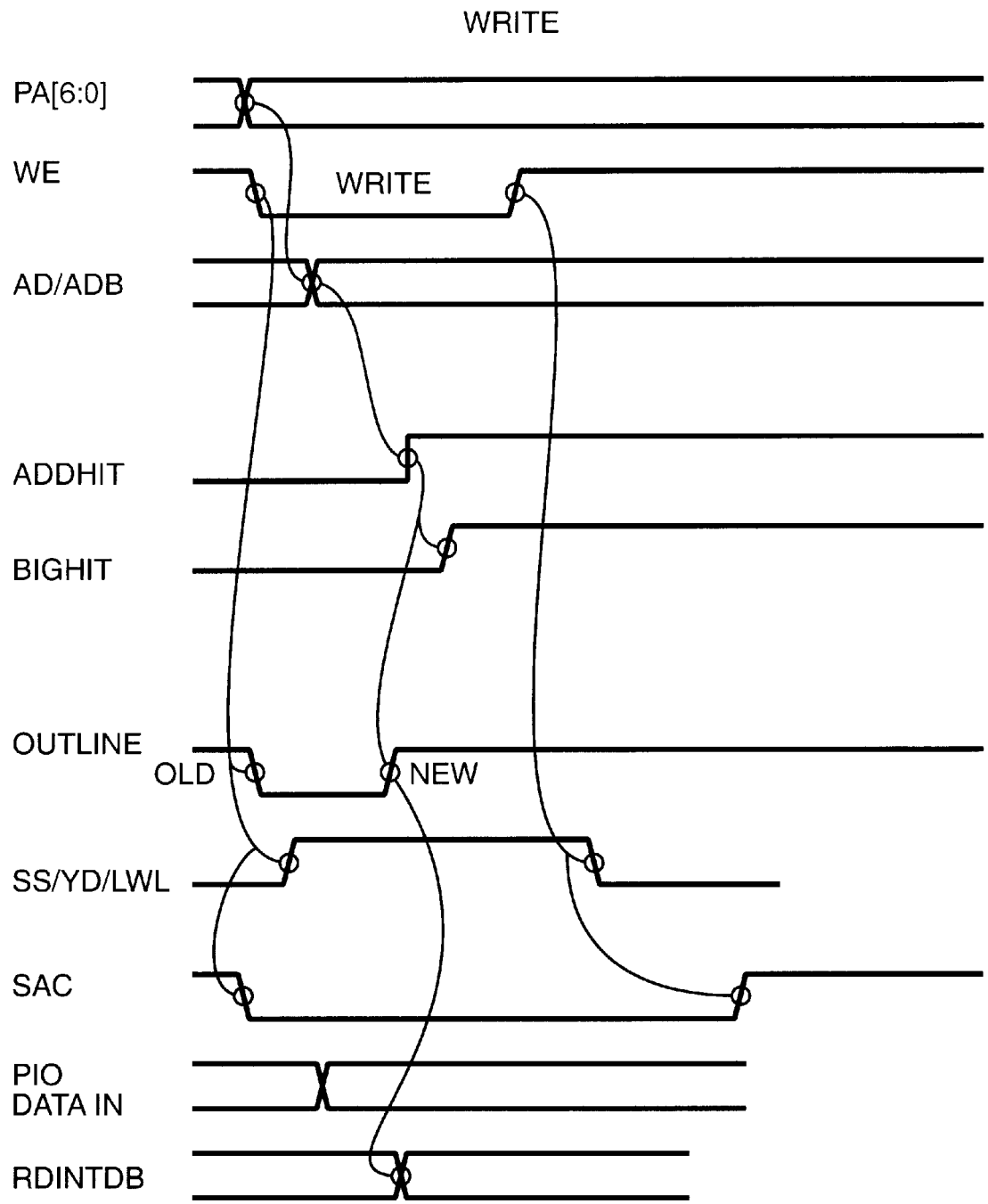
FIG._21

MEMORY COLUMN REDUNDANCY

BACKGROUND OF THE INVENTION

1. Field of the Invention

This invention relates to column-redundancy techniques for integrated-circuit memory devices.

2. Prior Art

Whenever one or more memory cells in a particular column of an integrated-circuit memory chip are defective, the entire memory column is considered to be defective and a redundant memory column is substituted for the defective column. To program a memory chip to substitute a redundant column for a defective memory column, a number of programming fuses are blown with a laser beam. Conventional column-redundancy methodology in an integrated-circuit memory device normally requires a large number of fuses for each redundant column, which uses a considerable area of the integrated-circuit chip.

When a particular Y select address for a redundant column is received in a memory chip with a conventional column-redundancy approach, the memory chip is programmed to enable a redundant senseamp and also to disable a normal senseamp. This is accomplished by blowing one fuse to turn on transfer gates that allow all of the Y-select signals to go to a redundant Y select NAND circuit. Then, since all of the signals are going to the NAND circuit, eight more fuses are blown to stop unwanted Y select signals from getting to the NAND circuit. One more fuse is then blown to disable the normal Y-select NAND circuit enable signal. Blowing ten of nineteen fuses causes the normal senseamp to go to an inactive state and the redundant senseamp to go to an active state.

To connect the redundant senseamp to a particular output buffer, the output terminal of the redundant senseamp is connected through series fuses to each one of eight internal data bus lines, where each internal data buss line connects to a particular output buffer. To connect the redundant senseamp to a particular output buffer seven of eight fuses are required to be blown.

For writing data into the memory chip, eight series fuses are used to connect the internal data bus lines to a common node that goes to the drivers of the redundant bit line and bit inverse columns. To remove the unwanted connections of this scheme, seven additional fuses have to be blown.

For the conventional column redundancy methodology described above, the number of fuses per redundant column is 35 and the number of fuses blown per redundant column is 24. An example of a conventional column redundancy methodology, which illustrates the total number of fuses required for conventional column-redundancy, is a 4 Mbit SRAM with 32 redundant columns. Each of the redundant columns requires 35 for a total of 1120 fuses. For the 4 Mbit SRAM, a minimum of 24 fuses are required to be blown for each redundant column. Therefore, utilizing all 32 of the redundant columns requires a minimum of 768 fuses to be blown. The locations of all of these 1120 fuses must be programmed into the software that controls a laser that is used to blow these fuses. In the fabrication and testing of memory chips that have conventional redundant memory columns, additional time and expense are required to blow all of the fuses for substitution of a redundant memory column for a damaged or otherwise unusable memory column.

Consequently, a need exists for a column-redundancy methodology for an integrated-circuit memory chip that greatly reduces the number of fuses required to be blown for substitution of a redundant column for a defective column.

SUMMARY OF THE INVENTION

It is therefore an object of the invention to provide an improved column-redundancy technique for a memory chip that greatly reduces the number of fuses that are blown for substituting a redundant memory column for a defective memory column.

In accordance with this and other objects of the invention, a method and apparatus are provided which compares and matches an incoming memory address signal with static signals provided by a fuse array. The static signals represent an address of a defective memory column that is being replaced by a redundant memory in a memory chip. For an exemplary static random access memory SRAM chip according to the invention, each of the redundant columns is provided with an individual senseamp.

The present invention provides column redundancy for a memory, chip which has a plurality of sections, each of which sections is addressed with a section-select address signal. Each section includes a corresponding redundant column for replacement of a damaged, defective, or otherwise unusable memory column in that particular section of the memory.

Each redundant column of the memory is individually connected to a separate redundant-column senseamp that is activated by a memory section-select signal in combination with a BIGHIT signal. The BIGHIT signal indicates that the memory chip has received any address of a defective memory column. All of the output terminals of the redundant column senseamps are connected in common to a redundant internal data bus RDINTDB.

A defective-column-address detector circuit is provided for each memory section. The detector circuit compares each incoming multi-bit memory address signal (for a memory section and a column in that memory section) to an address of a defective memory column and provides an address-hit signal ADDHIT if a match occurs therebetween. A BIGHIT circuit combines the ADDHIT signals for all of the memory sections to provide the BIGHIT signal when any one ADDHIT signal is present.

A 2:1 multiplexer is provided for each output terminal of the memory chip. One input terminal of each of the 2:1 multiplexers is connected to the redundant internal data bus RDINTB. The other input terminal of each of the 2:1 multiplexers is normally coupled to an internal data bus INTDB that is connected to an output terminal of one of the normal senseamps for the memory chip. Each of the 2:1 multiplexers is normally set to connect the second input terminal to its output terminal. Each of the 2:1 multiplexers is selected by a respective output terminal select signal OUTLINE to connect the redundant internal data bus RDINTDB to an associated one of the output terminals of the memory chip;

An output decoder circuit OUTDEC assigns a particular ADDHIT signal for a particular redundant column to a particular OUTLINE signal, which couples a particular redundant column to a particular output terminal, or pin, of the memory chip.

Each of the normal senseamps is connected to a plurality of input terminals coupled to normal memory columns.

The defective column address detector circuit includes an exclusive logic circuit that compares each bit of the multi-bit memory address signal to respective static bits representing an address of a defective column. The static bits for the address of the replaced column are provided by an array of fuses, which are adapted to be blown by a laser beam.

The BIGHIT circuit includes a logic OR circuit for combining the ADDHIT signals. The output decoder circuit OUTDEC includes a circuit that connects an ADDHIT signal to a particular OUTLINE signal. Predetermined fuses are blown to direct the ADDHIT signal to select a particular output pin of the memory chip.

A method provides column-redundancy to a memory chip, including the steps of: connecting an input terminal of each of a plurality of separate redundant senseamps to a respective redundant memory column; connecting in common an output terminal of each of the separate redundant senseamps to a redundant internal data bus (RDINTB); selectively activating only one at a time of the separate redundant senseamps upon receipt of both a memory-section-select signal and a BIGHIT signal, which receipt indicates that an address of any defective memory column has been received by the memory chip, such that only one of the separate redundant senseamps is activated at any one time; connecting the redundant internal data bus (RDINTB) to a first input terminal of each of a plurality of 2:1 multiplexers; connecting a second input terminal of each of the plurality of the 2:1 multiplexers to a respective internal data bus (INTDB) that is connected to an output terminal of a normal senseamp for the memory chip; normally connecting the second input terminal of the 2:1 multiplexer to an output terminal of the 2:1 multiplexer; coupling the respective output terminals of each of the 2:1 multiplexers to a respective output terminal of the memory chip; and activating one of the 2:1 multiplexers with an output terminal selection signal to thereby couple the redundant internal data bus to a predetermined output terminal of the memory chip.

A comparison between the conventional column redundancy in the 4 Mbit SRAM and the column redundancy invention system in the 1 Mbit SRAM according to the present invention shows that there is a considerable improvement in reducing the number of fuses required to be blown to use a redundant column to replace a defective memory column. The column redundancy scheme for the conventional memory requires 35 fuses per redundant column. The column redundancy scheme for the memory according to the invention requires 11 fuses per redundant column, of which an average of 5.5 are blown per redundant column.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a block diagram showing two typical senseamps for two redundant columns and also showing two typical buffers and output pads for a memory chip having a redundant-columns connection scheme according to the invention.

FIG. 2 is a block diagram showing an address hit ADDHIT cell that screens input address signals for a defective column and also showing an OUTDEC cell, which assigns a redundant column to a particular output terminal of a memory chip having column redundancy according to the FIG. 3 is a circuit diagram that shows 16 redundant senseamps and associated control signals for an exemplary memory chip having column redundancy according to the invention.

FIG. 4 is a circuit diagram of a redundant senseamp RDRASA cell, one of which is connected to each redundant column.

FIG. 5 is a circuit diagram of a high impedance buss holding latch cell BUSSLAT that is connected to a redundant internal data bus.

FIG. 6 is a block diagram of an INOUT cell, showing 8 input/output cells associated with the input/output pins and the regular internal data bus INTDB lines.

FIG. 7 is a block diagram of an input/output IO cell with an output buffer and input buffer.

FIG. 8 is a circuit diagram for an input buffer.

FIG. 9 is a circuit diagram of an output buffer.

FIG. 10 is a circuit diagram of a STARTD cell, which stretches the second edge of a start signal.

FIG. 11 is a block diagram of a DUMP cell, which pulls down a previously activated OUTLINE line, if it was activated before the cell OUT signal enables a new OUTLINE signal.

FIG. 12 is a block diagram of an ADDHIT cell showing connections to a BIGHIT cell and to an OUTDEC cell.

FIG. 13 is a circuit diagram of a fuse circuit FUSEA that puts out a one if a fuse is not blown or a zero if the fuse has been blown by a laser beam.

FIG. 14 is a block diagram of a FUSEADD cell, showing 7 fuses associated with a 4-bit section select address and showing three fuses that select which one of 8 columns goes to a particular output pin of the memory chip with column redundancy according to the invention.

FIG. 15 is a block diagram of an ADDXNOR cell that detects an address hit and which provides for locking out the gating of an all ones address.

FIG. 16 is a circuit diagram of an XNOR cell, which provides a one output for the same inputs and a zero output for dissimilar inputs.

FIG. 17 is a block diagram of a BIGHIT cell, which combines 16 ADDHIT signals.

FIG. 18 is a schematic diagram of an OUTDEC cell, illustrating connection of the redundant internal data bus to a particular output buffer using an OUTLINE signal.

FIG. 19 is a circuit diagram of an OUT cell, which is selected to provide an OUTLINE signal connection of a redundant column to a particular memory chip pin.

FIG. 20 is timing chart for a read operation for a memory column redundancy scheme according to the present invention.

FIG. 21 is a timing chart for a WRITE operation for the memory column redundancy scheme according to the invention.

DETAILED DESCRIPTION OF THE PREFERRED EMBODIMENT

Reference is now made in detail to one preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

For purposes of illustrating the invention, an exemplary 1 Mbit SRAM chip is provided with a column-redundancy scheme according to the present invention. This exemplary memory chip has 16 sections, which requires four address bits to decode which section is being addressed. The memory chip has eight output terminals, or pins, which requires three address bits. Each output terminal has eight memory columns associated therewith in each section. To determine which one of its eight associated columns goes to a particular output terminal requires three addresses. Each memory section has a total of 64 columns, each with 1024 memory cells.

A particular combination of fuses is blown, for example, with a laser to determine the location of a particular damaged memory column. Therefore, one needs to know the section number for one of the sixteen sections, the output terminal number for one of the eight memory columns, and the particular output number for one of the eight output terminals. Ten fuses are used to identify the location of a particular damaged column. Four fuses are used to represent the addresses of the section, three fuses are used to represent the addresses of one out of the eight columns that go to a particular output terminal of the memory chip, and three additional fuses are used to represent a particular output terminal.

The invention compares and matches an incoming memory address signal with static signals provided by a fuse array that represents an address of a defective memory column that is being replaced by a redundant memory column. Each of the redundant columns for each of the sixteen memory sections is also provided with an individual senseamp.

FIG. 1 shows two typical senseamps out of a total of sixteen senseamps for an exemplary 1 Mbit SRAM chip having a column-redundancy scheme according to the invention. FIG. 1 also shows two typical buffers and data input/output pads out of a total of eight. THE input/output pads are connected to the external pins of the package for the memory chip.

The input terminals of a redundant senseamp RDRSA0 10 are connected to a REDUNDANT COLUMN 0. Each of the 16 memory sections of the 1 Mbit SRAM has a redundant memory column for replacement of a defective column in that memory section. Each redundant column has connected thereto a separate redundant-senseamp. The output terminal of the redundant senseamp 10 is connected in common with all of the output terminals of the other fifteen redundant senseamps to a redundant internal databus RDINTDB 12 for the 1 Mbit SRAM chip.

Only one senseamp at a time is activated by a combination of two control signals, SECTIONSELECT and BIGHIT. Each senseamp, such as the redundant senseamp 10, is activated when both of two control signals are activate at two control-signal input terminals. One of these control signals is a SECTION SELECT 0 signal and the other is a BIGHIT signal. The BIGHIT signal indicates that the memory chip has received an address for any one of the defective memory columns. The BIGHIT signal is active whenever any address for a redundant column is selected. The SECTION SELECT 0 signal is active when the particular REDUNDANT COLUMN 0 is to be used. Because both of these control signals for the redundant senseamp 10 must be simultaneously active, only one of the sixteen redundant senseamps can be active at any one time to provide memory data to the redundant internal databus RDINTDB 12 from one of the redundant columns.

The other typically shown senseamp RDRASA1 14 has its input terminals connected to a REDUNDANT COLUMN 1. The output terminal of the redundant senseamp 14 is also shown connected in common to the redundant internal databus RDINTDB along with the output terminals of the other fifteen redundant senseamps. The redundant senseamp 14 is also activated only when both the SECTIONSELECT1 signal and the BIGHIT signal are active. The SECTION-SELECT 1 signal is active when a particular redundant column is to be connected to a particular output pad and memory chip pin.

An output pad 16 for the output signal OUTPUT 0 of the exemplary 1 Mbit SRAM chip is driven by an output terminal of an output buffer 18. An input terminal of the buffer 18 is connected to an output terminal of a 2:1 multiplexer 20. One of the input terminals of the 2:1 multiplexer 20 is connected to the redundant internal databus RDINTDB 12 for the 1 Mbit SRAM chip. The other input terminal of the 2:1 multiplexer 20 is connected to one of the normal internal data buses of the memory chip, such as a normal internal data bus output INTBD0, which is connected to an output terminal of a regular senseamp 22 of the memory chip. The normal internal data busses INTB [7:0] are normally connected to one of the input terminals of the 2:1 multiplexers. A control signal OUTLINE0 controls the 2:1 multiplexer 20 such that if OUTLINE0 is active, the redundant column memory data signal on the redundant internal data bus output RDINTDB 12 goes to the input terminal of the output buffer 18.

Normal operation of the memory occurs when no redundant column is selected. In this case, the input terminal of the regular senseamp 22 of the memory chip is connected to an output terminal of an 8:1 multiplexer 24. Each of the eight input terminals of the 8:1 multiplexer 24 is connected to one of the eight regular memory columns associated with the OUTPUT 0 terminal6.

Another output pad 26 for the output signal OUTPUT 1 of the exemplary 1 Mbit SRAM chip is driven by an output terminal of another output buffer 28. An input terminal of the buffer 28 is connected to an output terminal of another 2:1 multiplexer 30. One of the input terminals of the 2:1 multiplexer 30 is also connected to the redundant internal databus RDINTDB 12 for the 1 Mbit SRAM chip. The other input terminal of the 2:1 multiplexer 30 is connected to another internal data bus output INTDB1, which is similarly connected to an output terminal of another regular senseamp 32 of the memory chip. A control signal OUTLINE1 controls the 2:1 multiplexer 30 such that if OUTLINE1 is a zero, the memory data signal on the regular internal data bus output INTDB1 goes to the input terminal of the output buffer 28. If OUTLINE1 is a one, the redundant column memory data signal on the redundant internal data bus RDINTDB goes to the input terminal of the output buffer 28. The input terminal of the other regular senseamp 32 is connected to an output terminal of another 8:1 multiplexer 34. Each of the eight input terminals of the 8:1 multiplexer 34 is connected to one of the eight regular memory columns associated with the OUTPUT 1 terminal 26. The exemplary 1 Mbit SRAM includes fourteen additional redundant senseamps, all having output terminals connected to the redundant internal data bus RDINTBD 12. Also provided are six additional groups of 2:1 multiplexers, output buffers, and internal senseamps. The input terminals of each internal senseamp are connected to an output terminal of an 8:1 multiplexer, each of which is used to select one of eight regular memory columns.

FIG. 2 is a block diagram showing an address hit ADDHIT cell 40, which compares an incoming multi-bit memory address signal for a memory section and a column in that memory section to an address of a defective memory column. One of sixteen address hit signals ADDHIT[15:0] is generated if a match occurs therebetween. The ADDHIT cell receives a 7 bit input address signal ADDRESS[7:0] and compares it to a static signal provided by a fuse array. The fuse array represents an address of a defective memory column that is being replaced by a redundant memory column in the 1 Mbit memory chip. If a defective column address match occurs, then one of the sixteen ADDRESSHIT[15:0] signals is activated, or goes high. Each of the redundant columns, has one of 16 ADDRESSHI [15:0] signals associated with it.

As illustrated in FIG. 2, an ADDRESSHIT[15:0] signal has two functions. The first function is to provide an input signal to a BIGHIT circuit 40, which combines all of the ADDHIT signals from all of the memory sections to provide a BIGHIT signal whenever any one of the ADDHIT signal is present. The BIGHIT circuit monitors all of the 16 ADDRESSHIT[15:0] signals, so that if any one of the 16 ADDHIT signals is energized, then the BIGHIT summing circuit 42 provides an output BIGHIT signal, which is connected to all of the 16 redundant senseamps. As previously mentioned, the BIGHIT signal and a particular section-select signal turn on the redundant senseamp that is dedicated to replace a defective memory column in a particular section.

All of the sixteen redundant senseamps, typically shown as 10, 14 in FIG. 1, are setup to drive the single redundant internal data bus line RDINTDB 12. The bus line RDINTDB 12 is connected to the output buffers, typically shown as 18, through a 2:1 multiplexer, typically shown as 20, 30. The other inputs to the 2:1 multiplexers are regular, non-redundant data signals from the memory columns of the memory. Each of the 2:1 multiplexers is normally set to connect the second input terminal to its output terminals. Each of the 2:1 multiplexers is controlled by a respective output terminal select signal OUTLINE to select the redundant internal data bus line RDINTDB 12 and connect it to its output terminal.

The second function of each of the ADDRESSHIT[15:0] signals is to provide an input signal to an output decoder circuit OUTDEC, typically shown as 44 in FIG. 2, which receives one of the ADDRESSHIT[15:0] signals and steers it to one of the OUTLINE[7:0] terminals as programmed by a fuse array. The output decoder circuit OUTDEC is programmed to assign a particular ADDHIT signal for a particular redundant column to a particular OUTLINE[7:0] signal, in order to couple a particular redundant column to a particular output pin of the memory chip. Each of the 16 ADDRESSHIT[15:0] signals has its own decoder circuit OUTDEC, similar to 44. The output signal OUTLINE[7:0] controls one of the 2:1 multiplexers to gate the signals on the redundant internal data line RDINTDB 12 to a particular output buffer as controlled by a fuse array.

FIG. 3 is a block diagram that shows all 16 of the redundant senseamps RDRSA0–RDRSA15 for the 1 Mbit SRAM, which include the exemplary senseamps RDRSA0 10 and RDRSA1 14 of FIG. 1. The signals RC[15:0] and RCI[15:0] are the bitline signals and the inverted bitline signals for the respective 16 redundant columns.

FIG. 4 shows a circuit diagram of a typical redundant senseamp RDRASA cell, one of which is individually connected to each one of the redundant columns RC and to the inverted redundant column RCI of the redundant memory columns RDRSA0–RDRSA15. The RDRSA cell is a modification of a standard senseamp with the addition of the input signals BIGHIT and SS being combined in a NAND gate to provide control signals for a pair of transfer gates 72,73 from the respective column signals RC and RCI. The SS signal is the SELECTIONSELECT signal of FIG. 1. One and only one of the redundant senseamps is selected at a time. The output signal of the one selected RDRSA cell is connected to the redundant internal data bus RDINTDB. When a redundant senseamp is selected with BIGHIT and one of the SS signals, a redundant column is connected through the redundant senseamp to the redundant internal data bus 12 of FIGS. 1 and 3.

As illustrated in FIGS. 3 and 4, each of the redundant senseamps has various control signals connected thereto. The BIGHIT signal is connected to all of the 16 senseamps. The redundant internal databus RDINTDB 12 is connected to output terminals of the senseamps. The SST[7:0] and SSB[7:0] signals on busses 54,56 of FIG. 3 are the same as the 16 memory-section select signals, such as SECTIONSELECT0 and SECTIONSELECT1 of FIG. 1 Each of these signals is connected to one of the redundant senseamps and combined with the BIGHIT signal to enable one of the redundant senseamps. The PIO[7:0] signal lines on a bus 62 in FIG. 3 are connected to the 8 input/output terminals, or pins, of the memory chip.

Other control signals in FIG. 4 include READ and WRITE, which begins with its first edge and ends with its second edge. The senseamp select signal SAC going low disconnects the senseamp from the INTDB line or the RDINTDB line while the input to the senseamp is being established. The SAC signal going high allows the sensesamp to evaluate what memory data is on its input and to put this information onto the INTDB or RDINTDB line.

FIG. 3 and FIG. 5, in more detail, show a bus latch cell BUSSLAT 58, which is a high impedance-holding latch for signals provided on the redundant internal data bus RDINTDB 12.

FIG. 3 also shows an INOUT cell 60 that has two functions. One of these functions is to normally connect a normal memory column to an output terminal, or pin, of the memory chip. The other function of the INOUT cell 60 is to provide for substitution of a redundant memory column for a defective memory column whenever an address of a defective memory column is received by the memory chip. When a redundant memory column is selected, the INOUT cell 60 also generates a BIGHIT signal and one of the signals for OUTLINE[7:1] This combination of signals then connects a redundant column and its dedicated senseamp to a predetermined output terminal of the memory chip.

The INOUT cell 60 contains the ADDHIT cell 40, which contains the BIGHIT cell 42, and the OUTDEC cell 44 shown in FIG. 2. THE INOUT cell 60 also includes a plurality of 2:1 multiplexers, each of which is controlled by a respective output terminal select signal OUTLINE to connect either a normal memory column or a redundant memory column to an output terminal of the memory chip.

FIG. 5 illustrates a BUSSLAT cell 58, which is a high impedance bus latch cell that is connected to the RDINTDB line 12, as illustrated in FIG. 3.

FIG. 6 is a more detailed block diagram of the INOUT cell 60 of FIG. 3. As illustrated in FIGS. 6 and 3, a number of control signals are provided to the INOUT cell 60. These include: READ, START, WRITE, output latch OUTLAT, and output enable OE.

Eight signals PIO[7:0] of a bi-directional input/output data bus 62 are connected to respective I/O terminals, or pins, of the memory chip package. The redundant internal data bus line RDINTDB 12 and an eight-line bus 64 for the regular internal data bus with signal lines INTBD[7:0] are also connected to the INOUT cell 62. PA [6:0] are the 7 address signals associated with a memory section and a particular column of the 8 columns that go to a particular output pin through one of the senseamps.

The INOUT cell 62 has eight IO cells, typically shown as 80. These cells have common control signals WRITE, OUTLAT and output enable OE. A specific one of the INTBO[7:0] signals and the OUTLINE[7:0] signals are connected to respective IO cells.

FIG. 7 shows that the IO cell 80 has an input data buffer DIN, typically shown as 82, and an output data buffer DOBUF6, typically shown as 84, both of which share the control signals OUTLINE and WRITE. The input data buffer DIN 82 and the output data buffer DOBUF6 84 are both connected to the PIO signal at the memory chip terminal. Both of these buffers also share the internal data bus INTDB and the redundant data bus RDINTBD. The output data buffer DOBUF6 84 is also provided with an output latch signal OUTLAT and an output enable signal OE.

FIG. 8 is a circuit diagram for the data input cell DIN 82. For the writing mode, the control signal OUTLINE connects the PIO input signal to the RDINTDB line through the data input cell DIN 82. The signal OUTLINE, when active, switches the input data PIO from INTDB to RDINTDB. A delay line delays the input data until after the WRITE signal terminates so that the input data can be changed at the same time that the write signal ends with no adverse effects.

FIG. 9 is a circuit diagram of an output buffer cell DOBUF6 84, which is a modified version of an original output buffer cell. This cell provides for column redundancy by adding a 2 input mux for selecting the RDINTDB or the INTBD signal with the gating control signal OUTLINE.

FIG. 10 illustrates a STARTD circuit 70 that receives a START input signal, which is a signal generated by any address signal transition, to generate a STARTD.

FIG. 11 illustrates a DUMP cell, which uses the STARTD signal to pull down a previously activated OUTLINE line before the OUT cell brings up a new OUTLINE signal. The width of the STARTD pulse is designed to be wide enough to allow a previously activated OUTLINE signal to be pulled down all the way to zero. Cell dump has two conditions to pull down OUTLINE, one is for the read memory cycle and the other is for the write memory cycle. When a signal the READ signal goes to zero, the Write mode is activated. STARTD in cell DUMP pulls down the old activated OUTLINE signal for a read memory cycle. The signal OUTLINE has an attached high impedance latch to hold down the unactivated seven out of the 8 or the 8 out of the 8 OUTLINEs.

FIG. 12 shows an ADDHIT cell 74, which receives a READ signal and seven address signals PA[6:0] on a section/memory column address bus 76. The 7 bits on PA[6:0] identify one of the sixteen memory sections and a particular column out of the 8 columns that go to a particular output through a normal senseamp. The ADDHIT signals AH[16:1] are connected to the cell BIGHIT cell 42 in FIG. 2 and to the sixteen OUTDEC cells 44 in FIG. 2, which provide the eight OUTLINE[7:0] signals. The ADDHIT cell includes sixteen FUSEADD cells, typically shown as 90 in FIG. 12. Each of the ADDHIT signals AH[16:1] is an input signal to one of sixteen ADDXNOR circuits, typically shown as 92 in FIG. 12.

FIG. 13 is a circuit diagram of a typical fused circuit that puts out a one if the fuse is not blown, or a zero if blown, for example, by a laser beam.

FIG. 14 is a block diagram of a FUSEADD cell 90 in FIG. 12, which shows the seven fuses associated with the four section select addresses and the three addresses that select which one of the eight memory columns goes to a particular output through a senseamp. A FUSEADD cell includes seven FUSEA circuits of FIG. 13. Each of the sixteen FUSEADD circuits has seven output signals F[6:0], which are input signals to one of sixteen ADDXNOR circuits, typically shown as 92 in FIG. 12.

FIG. 15 is a block diagram of an ADDXNOR cell, showing the creation of the ADDHIT signal and also showing the lockout or the gating of the all ones address case. The all ones case shows the eleventh fuse requirement for a redundant column. Also contained within cell ADDXNOR is an all ones detect circuit that inhibits the ADDHIT signal if the memory address is all ones and if a yes/no fuse is programmed no, meaning the all ones address does not require a redundant column. Blowing the fuse is a yes. FIG. 16 is a circuit diagram a basic XNOR circuit. See the associated truth table.

FIG. 17 is a block diagram of a BIGHIT cell, showing the creation of a BIGHIT signal from the 16 ADDHIT signals.

FIG. 18 is a schematic diagram of a typical OUTDEC cell 94 in FIG. 12, which generates one of the OUTLINE[7:0] signals. The OUTLINE[7:0] signals are used to connect the redundant internal data line RDINTDB 12 to one of the eight output pins of the memory chip, as indicated in FIG. 1. Three fuses in FUSEA are selectively blown to decode which output pin is to be used. A series of NAND gates provide an 8:1 decoder. Eight OUT cells, typically shown as 98, are enabled by one of the ADDHIT[16:1] signals. FIG. 12 shows that there are sixteen OUTDEC cells connected to the eight OUTLINE signals and one OUTDEC cell drives a particular OUTLINE signal, if any.

FIG. 19 is a circuit diagram of the typical OUT cell with an OUTLINE output signal as determined by the control signals IN, ADDHIT, STARTD, and READ. The width of the STARTD pulse is set to be wide enough to allow OUTLINE to be pulled down all the way to zero. STARTD activates the new OUTLINE signal when STARTD goes inactive after going active if ADDHIT and IN are provided for a read memory cycle. IN comes from the output decoder results.

FIG. 20 is timing chart illustrating various timing signals for a read operation for the memory column redundancy scheme according to the invention. PA[6:0] are the 7 addresses associated with a particular one of the sixteen memory sections and with the particular column out of the eight columns that go to a particular output through a senseamp. AD/ADB represents an internal address and its inversion after going through an address buffer. START is a signal generated by any address transition. ADDHIT is activated by AD/ADB if there is a match between the seven fuses and an input address. BIGHIT is activated by any ADDHIT signal that goes active. SS a section select signal. The $y_d$ address is the y address. LWL represents the local word line address.

The senseamp control SAC going low disconnects the senseamp from the INTDB or RDINTDB line while the input to the senseamp is being established. SAC going high allows the sensesamp to evaluate what is on it's input and to put this information onto the INTDB or RDINTDB line. RDINTDB is loaded by the rising edge of the SAC signal. The output latch signal OUTLAT is used to gate in the INTDB or RDINTDB information to the output buffer. PIO is the output signal at an output pin of the memory chip.

FIG. 21 is timing chart illustrating various timing signals for a write operation for the memory column redundancy scheme according to the invention. PA[6:0] are the 7 addresses associated with a particular one of the sixteen memory sections and with the particular column out of the eight columns that are connected to a particular memory package pin. WE* is the inverted external write enable signal. A WRITE operation begins with its first edge and ends with the second edge. The signals AD/ADB, ADDHIT, BIGHIT, OUTLINE, SS/YD/LWL, SAC, RDINTDB are as explained previously in connection with READ timing. PIO is the data input signal at one of the eight input pins. The old OUTLINE signal is pulled down with the write signal instead of STARTD because the new OUTLINE signal has to occur before the data in the delay line in CELL DIN is outputted. Therefore, in the write memory cycle, the new OUTLINE signal is generated by ADDHIT signal to speed up generation of the new outline signal.

Comparison between a conventional column redundancy scheme, illustrated with a 4 Mbit SRAM, and a column redundancy scheme according to the invention, illustrated with a 1 Mbit SRAM, shows that the invention provides a significant improvement in reducing the number of fuses required. The conventional column-redundancy scheme requires 35 fuses per redundant column, while the column redundancy scheme according to the invention requires only 11 fuses per redundant column. The original column-redundancy scheme requires a minimum of 24 fuses to be blown per redundant column, while the column redundancy scheme according to the invention requires an average of 5.5 fuses to be blown per redundant column.

For normal operation of a memory chip provided according to the present invention, eight normal memory columns that would ordinarily go to a particular input/output pin are normally routed through one of the 8:1 multiplexers, typically shown as 24, 34 in FIG. 1. The output signal of this 8:1 multiplexer goes into a normal senseamp, typically shown as 22, 32. The output terminal of the normal senseamp is connected to one of the internal bus lines INTDB[7:0], which is selected by a 2:1 multiplexer, as illustrated by 20, 30 in FIG. 1, and routed to an output buffer, as illustrated by 18, 28 to drive an output pin of the memory chip.

To facilitate redundant-column operation, each redundant column goes directly to its own senseamp without going through an 8:1 multiplexer. Signal BIGHIT, along with one of the 16 section select signals SST[7:0], SSB[7:0] in FIG. 3 enables one of the redundant senseamps to put corresponding redundant column signal information on the redundant internal data line RDINTDB 12 in FIG. 1. RDINTDB is connected to the output terminals of all the redundant senseamps, but only one redundant senseamp at a time can be selected to drive the RDINTBD line 12. Each output buffer has a 2:1 input multiplexer, one input terminal of which is connected to a regular INTDB line and the other input terminals is connected to the RDINTDB line 12.

The RDINTDB line 12 is gated through one of the 2:1 multiplexers with one of the OUTLINE[7:0] signals. Three fuses are blown to select a particular OUTLINE signal for an output terminal of the memory chip. The state of the three fuses are decoded with an 8:1 decoder, the output signal of which associated with an ADDHIT signal to drive a particular OUTLINE signal that connects the RDINTDB line 12 to a particular output buffer and memory chip pin. For writing information into a redundant column, a signal OUTLINE signal connects an input pin to the RDINTDB line through a DIN. BIGHIT and an associated SECTION SELECT signal connect the RDINTDB line 12 to a redundant column through one of the redundant senseamps.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A memory chip having column redundancy, comprising:

the memory chip memory having a plurality of sections, where each of the sections is addressed with a section-select address signal and where each section includes a corresponding redundant column for replacement of a defective column in a section;

each redundant column having connected thereto a separate corresponding redundant-column senseamp, wherein each redundant-column senseamp has an output terminal and wherein each redundant-column senseamp is activated by a corresponding memory section-select signal in combination with a BIGHIT signal, where the BIGHIT signal indicates that the memory chip has received an address of a defective memory column;

for each memory section, a defective-column-address detector circuit which compares an incoming multi-bit memory address signal for a memory section and a column in that memory section to an address of a defective memory column, and which provides an address hit signal ADDHIT if a match occurs therebetween;

a BIGHIT circuit which combines the ADDHIT signals for all of the memory sections to provide the BIGHIT signal when any ADDHIT signal is present; and a plurality of 2:1 multiplexers, each of which has a first input terminal to which are coupled in common all of the output terminals of the redundant column senseamps;

wherein each of the 2:1 multiplexers has a second input terminal to which is coupled an output terminal of one of the normal senseamps for the memory chip;

wherein each of the 2:1 multiplexers has an output terminal that communicates with a respective one of the output terminals of the memory chip;

wherein each of the 2:1 multiplexers normally is set to connect the second input terminal to its output terminal and wherein each of the 2:1 multiplexers is controlled by a respective output terminal select signal OUTLINE to select the first input terminal for connection to its output terminal; and an output decoder circuit OUTDEC that assigns a particular ADDHIT signal for a particular redundant column to a particular OUTLINE signal, to couple a particular redundant column to a particular output pin of the memory chip.

2. The memory chip of claim 1 wherein each of the input terminals of the normal senseamps is connected to an output terminal of a normal senseamp multiplexer that has a plurality of input terminals coupled to normal memory columns.

3. The memory chip of claim 1 wherein the defective column address detector circuit includes a circuit ADDX-NOR that compares each bit of the multi-bit memory address signal to respective static bits representing an address of a defective column.

4. The memory chip of claim 3 wherein the circuit ADDXNOR uses exclusive logic to compare bits.

5. The memory chip of claim 3 wherein some of the static bits for the address for the replaced column are provided by an array of fuses.

6. The memory chip of claim 5 wherein the fuses of the array are adapted to be blown by a laser beam.

7. The memory chip of claim 1 wherein the BIGHIT circuit includes a logic OR circuit for combining the ADDHIT signals.

8. The memory chip of claim 1 wherein the output decoder circuit OUTDEC includes a circuit that connects an ADDHIT signal to a particular OUTLINE signal and that is controlled by blowing predetermined fuses to select a particular output pin of the memory chip.

9. A method for providing column-redundancy to a memory chip, comprising the steps of:

connecting an input terminal of each of a plurality of separate redundant senseamps to a respective redundant memory column;

connecting in common an output terminal of each of the separate redundant senseamps to a redundant internal data bus (RDINTB);

selectively activating only one at a time of the separate redundant senseamps upon receipt of both a memory-section-select signal and a BIGHIT signal, which receipt indicates that an address of any defective memory column has been received by the memory chip, such that only one of the separate redundant senseamps is activated at any one time;

connecting the redundant internal data bus (RDINTB) to a first input terminal of each of a plurality of 2:1 multiplexers;

connecting a second input terminal of each of the plurality of the 2:1 multiplexers to a respective internal data bus (INTDB) that is connected to an output terminal of a normal senseamp for the memory chip;

normally connecting the second input terminal of the 2:1 multiplexer to an output terminal of the 2:1 multiplexer;

coupling the respective output terminals of each of the 2:1 multiplexers to a respective output terminal of the memory chip; and activating one of the 2:1 multiplexers with an output terminal selection signal to thereby couple the redundant internal data bus to a predetermined output terminal of the memory chip.

* * * * *